US007099155B2

(12) United States Patent
Kobayashi et al.

(10) Patent No.: US 7,099,155 B2
(45) Date of Patent: Aug. 29, 2006

(54) DISTRIBUTION UNIT AND ELECTRIC CONNECTION BOX INCLUDING THE SAME

(75) Inventors: Takehito Kobayashi, Mie (JP); Shigeki Yamane, Mie (JP); Takahiro Onizuka, Mie (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 294 days.

(21) Appl. No.: 10/777,125

(22) Filed: Feb. 13, 2004

(65) Prior Publication Data

US 2004/0223304 A1    Nov. 11, 2004

(30) Foreign Application Priority Data

Feb. 14, 2003  (JP)  ............................. 2003-036479
Feb. 14, 2003  (JP)  ............................. 2003-037035

(51) Int. Cl.
*H05K 7/20*    (2006.01)

(52) U.S. Cl. ...................... 361/719; 361/641; 361/704; 174/52.1; 174/52.2; 165/80.3

(58) Field of Classification Search ................ 361/715, 361/704; 439/76.2
See application file for complete search history.

(56) References Cited

U.S. PATENT DOCUMENTS 5,295,842 A * 3/1994 Ozaki et al. ............... 439/76.2
5,478,244 A * 12/1995 Maue et al. ................ 439/76.2
5,598,322 A * 1/1997 Von Arx et al. ............ 361/704
5,814,765 A * 9/1998 Bauer et al. ............. 174/50.54
6,008,982 A * 12/1999 Smith .......................... 361/624
6,511,331 B1 * 1/2003 Saito et al. ................ 439/76.2
6,522,528 B1 * 2/2003 Yamane ...................... 361/601
6,724,627 B1 * 4/2004 Onizuka et al. ............ 361/704
2002/0168882 A1 * 11/2002 Chiriku et al. ............. 439/76.2

FOREIGN PATENT DOCUMENTS

| JP | A 11-204700 | 7/1999 |
| JP | A 2001-319708 | 11/2001 |
| JP | A 2002-165336 | 6/2002 |

* cited by examiner

*Primary Examiner*—Boris Chervinsky
(74) *Attorney, Agent, or Firm*—Oliff & Berridge, PLC

(57) ABSTRACT

A distribution unit has a power circuit section including a plurality of bus bars with electronic parts mounted on at least some of the bus bars. Ends of specific bus bars are projected from a main body section of the power circuit section in a adjacent manner to form fuse connection terminals. Each of the fuse connection terminals has a tip placement part to place a fuse terminal. An insulating case made of an insulating material for covering the power circuit section is opened in the projection direction of the fuse connection terminals to enable the fuse terminal to be placed in the tip placement part of the fuse connection terminal from the outside of the insulating case. The insulating case has a short-circuit prevention section intervening between the fuse connection terminals for preventing a short circuit between the fuse connection terminals.

6 Claims, 9 Drawing Sheets

DISTRIBUTION UNIT AND ELECTRIC CONNECTION BOX INCLUDING THE SAME

BACKGROUND OF THE INVENTION

1. Field of the Invention

This invention relates to a distribution unit for implementing a power circuit section for distributing power to a plurality of electronic units from a vehicle-installed power supply in a vehicle, such as an automobile, and an electric connection box including the distribution unit.

2. Description of the Related Art

Hitherto, an electric connection box containing fuses and relay switches built in a power circuit section provided by stacking a plurality of bus bar boards as means for distributing power to each electronic unit from a common vehicle-installed power supply has been known.

By the way, in recent years, a power distributor as a distribution unit having semiconductor switching elements such as FETs in place of or together with the relay switches, interposed between input and output terminals has been developed to accomplish miniaturization of the electric connection box and high-speed switching control. A power distributor having a power circuit section disposed via an insulating layer on the circuit disposition face of a heat radiation member from the viewpoint of radiating heat generated from semiconductor switching elements is also proposed (for example, JP-A-2001-319708, JP-A-2002-165336, and JP-A-11-204700).

The power circuit section of such a power distributor includes a circuit main body section disposed on the circuit face of a heat radiation member and external connection terminals made up of a plurality of specific bus bar ends to electrically connect to a vehicle-installed power supply, various units, etc. The circuit main body section is formed in one piece by a resin sold. On the other hand, the external connection terminals are gathered in a plurality of areas to form a terminal assembly. Such external connection terminals include fuse connection tab terminals, connector pins, etc., for example.

SUMMARY OF THE INVENTION

Although it is made possible to miniaturize the electric connection box as the power distributor as described above is introduced, furthermore miniaturizing the electric connection box is demanded.

Therefore, it is considered that the power distributor is made more compact for miniaturizing the electric connection box; however, miniaturization of the power distributor involves certain limits.

That is, if the power distributor is more miniaturized, the area in which the external connection terminals are gathered lessens accordingly and the external connection terminals are densely placed accordingly. In the state in which the external connection terminals are densely placed, the creepage distance for insulation of each external connection terminal is shortened and there is the fear of a short circuit between the external connection terminals. Therefore, the area in which the external connection terminals are gathered must be reserved as a predetermined extent so that such a short circuit does not occur. It is difficult to furthermore miniaturize the power distributor, particularly the power distributor provided with a plurality of terminal assemblies.

By the way, as a method of forming external connection terminals connected to an external circuit in such a power module, for example, the ends of the bus bars provided in the power circuit section disposed on the circuit disposition face are folded up to form the external connection terminals to be joined to an external connector. In the structure, however, the joining direction is limited to the direction of the normal to the circuit disposition face. Then, as means for setting the joining direction in the direction parallel with the circuit disposition face, it is possible to extend the end of the bus bar straightly along the circuit disposition face from the power circuit section. In this case, the insertion force at the connecting time with a different external terminal propagates directly to the power circuit section along the length direction of the external connection terminal and thus it is feared that the bus bar in the power circuit section may become deformed or that if the power circuit section is bonded to a heat radiation member, the bond face may peel off, etc., and by extension it is feared that a gap may be formed between the power circuit section and the heat radiation member, degrading the heat conduction efficiency.

If the end of the bus bar is extended straightly from the power circuit section, the external connection terminal is placed near on the circuit disposition face of the heat radiation member. Thus, even if the external connection terminal and the heat radiation member are at a distance from each other, if a large current or large power occurs, sufficient air insulation cannot be ensured and there is the fear of a short circuit. They may temporarily come in contact with each other because of vibration, etc., and cannot reliably be insulated from each other; this is a problem.

It is therefore an object of the invention to provide a distribution unit for making it possible to improve the leakage characteristic between external connection terminals according to a simple configuration and furthermore miniature the unit and an electric connection box including the distribution unit.

Another object of the invention to provide a distribution unit for making it possible to suppress the effect on a power circuit section if external terminals are joined to external connection terminals from the direction roughly parallel with the circuit disposition face, and moreover ensure reliable insulation.

According to a first aspect of the invention, there is provided a distribution unit including a power circuit section including a plurality of bus bars with electronic parts mounted on at least some of the bus bars and an insulating case being made of an insulating material for covering the power circuit section, characterized in that the ends of a plurality of specific bus bars included in the power circuit section are projected from a main body section of the power circuit section in a state in which they are placed near to each other to form fuse connection terminals, each of the fuse connection terminals is formed at a tip with a tip placement part to place a fuse terminal, the insulating case is opened in the projection direction of the fuse connection terminals so as to enable the fuse terminal to be placed in the tip placement part of the fuse connection terminal placed in the insulating case from the outside of the insulating case, and the insulating case is provided with a short-circuit prevention section intervening between the fuse connection terminals for preventing a short circuit between the fuse connection terminals.

According to the invention, the ends of a plurality of specific bus bars are projected from the main body section of the power circuit section in a state in which they are placed near to each other to form fuse connection terminals, so that the distribution unit can be made more compact. Since the fuse connection terminals are placed in a state in which they are placed near to each other, it is feared that a short circuit may occur between the fuse connection terminals, particularly between the tip placement parts requiring a given space to place the fuse terminal. However, according to the invention, the short-circuit prevention section intervening between the fuse connection terminals for preventing a short circuit between the fuse connection terminals is provided, so that a short circuit between the fuse connection terminals can be prevented. Moreover, the short-circuit prevention section is formed in the insulating case and thus the insulating case can be used effectively to improve the leakage characteristic between the fuse connection terminals according to the simple configuration.

According to a second aspect of the invention, in the distribution unit as in the first aspect, the insulating case has terminal insertion passages for separately inserting the fuse connection terminals and the insulation case portion between the terminal insertion passages is formed as the short-circuit prevention section. In doing so, a short circuit between the fuse connection terminals can be prevented simply by inserting the fuse connection terminals into the terminal insertion passages, and the leakage characteristic between the fuse connection terminals can be improved according to the still more simple configuration.

According to a third aspect of the invention, in the distribution unit as in the second aspect, at least a part of the terminal insertion passage is formed as a terminal insertion hole. That is, a terminal insertion groove, etc., for inserting the terminal is also possible as the terminal insertion passage; however, if terminal insertion holes are adopted as the terminal insertion passages, the insulating case can be used effectively to individually surround the outer peripheral surfaces of the fuse connection terminals by the insulating case, and a short circuit between the fuse connection terminals can be prevented more reliably.

According to a fourth aspect of the invention, in the distribution unit as in the third aspect, the insulating case is divided into a lower case and an upper case, at least either of these cases is provided with a terminal guide groove for guiding an external connection terminal inserted into the terminal insertion hole, and as the lower case and the upper case are assembled, the terminal guide groove forms the terminal insertion hole for the fuse connection terminal. In doing so, the fuse connection terminals can be easily inserted into the terminal insertion holes simply by assembling both the lower case and the upper case in a state in which the external connection terminal is housed in the terminal guide grove provided in at least either of the lower case and the upper case; the assembling work is facilitated.

According to a fifth aspect of the invention, there is provided an electric connection box including a distribution unit as in any one of the first to fourth aspects and a bus bar board including a plurality of bus bars forming a power circuit connected to the power circuit section of the distribution unit, characterized in that the fuse connection terminal is formed as a unit side fuse connection terminal, a part of the bus bar is projected from the bus bar board in a direction along the fuse connection terminal in the proximity of the unit side fuse connection terminal to form a bus bar board fuse connection terminal, and a fuse element is placed saddling the unit side fuse connection terminal and the bus bar board side fuse connection terminal.

According to the invention, the electric connection box includes the distribution unit that can be made more compact, so that the electric connection box itself can be made compact. Moreover, the fuse element is placed saddling the unit side fuse connection terminal and the bus bar board side fuse connection terminal, so that the occupation area of the bus bar board itself can also be reduced as compared with the case where all fuse elements are assembled on the board. Since the unit side fuse connection terminal and the bus bar board side fuse connection terminal are electrically connected through the fuse element, the number of connection parts decreases and the structure is simplified and the connection reliability is enhanced accordingly as compared with the case where bus bar terminals are abutted against each other and are joined aside from the disposition part of the fuse element.

According to a sixth aspect of the invention, there is provided a distribution unit wherein a power circuit section including a plurality of bus bars is disposed on a circuit disposition face of a heat radiation member, the distribution unit including external connection terminals formed by folding up ends of the bus bars placed near to each other from the circuit disposition face, a surround wall member being disposed in the heat radiation member so as to surround the power circuit section including the external connection terminals, and a connector housing having a bottom having terminal through holes into which the external connection terminals are inserted and a hood surrounding the external connection terminals projected to the opposite side to the circuit disposition face through the terminal through holes, the connector housing and the external connection terminals making up an external connection connector that can be joined to a different connector, characterized in that at the bottom of the connector housing, an insulating projection rib intervening between the external connection terminals and having a tip against which the different connector is abutted is projected on the tip side of the external connection terminals, and that a water resistance layer is formed in a state in which at least a part of the power circuit section is sealed inside the surround wall member and the water resistance layer leads to the inside of the connector housing through the terminal through hole and the top face of the water resistance layer is set higher than the bottom of the connector housing and is set lower than the tip face of the projection rib.

According to the invention, the ends of the bus bars placed near to each other are folded up from the circuit disposition face to form the external connection terminals, so that the distribution unit can be formed more compact. Moreover, the surround wall member is formed inside with the water resistance layer for sealing at least a part of the power circuit section, so that effective water resistance of the power circuit section can be provided. The water resistance layer leads to the inside of the connector housing through the terminal through hole and the top face of the water resistance layer is set higher than the bottom of the connector housing, so that the water resistance layer being formed in the connector housing can be visually recognized and thus the base end parts of the external connection terminals can be sealed reliably with the water resistance layer and insulation at the base end parts of the external connection terminals can be ensured reliably.

On the other hand, at the bottom of the connector housing, the insulating projection rib intervening between the external connection terminals and having the tip against which the different connector is abutted is projected on the tip side of the external connection terminals, and the top face of the water resistance layer is set lower than the projection rib. Thus, for example, if a water drop is deposited on the top face of the water resistance layer, the projection rib further projected upward from the water resistance layer can serve as a barrier, reliably preventing the water drop from causing a direct short circuit between the adjacent external connection terminals. That is, if the projection rib is embedded in the water resistance layer, it is feared that the deposited water drop may easily intervene between the external connection terminals and cause a direct short circuit between the adjacent external connection terminals. According to the invention, the direct short circuit between the external connection terminals can be prevented reliably as described above.

According to a seventh aspect of the invention, in the distribution unit as in the sixth aspect, the connector housing is formed at the bottom with a resin reservoir recess next to the connector abutment face against which the tip face of the different connector abuts, the terminal through holes are made in the formation area of the resin reservoir recess, the projection rib is provided at the connector bottom between the terminal through holes, and the tip face of the projection rib is positioned corresponding to the connector abutment face. In doing so, the tip face of a different connector is abutted not only against the tip of the projection rib, but also against the connector abutment face, and the insertion force when the different connector is inserted and connected can be distributed. Therefore, the projection rib can be made thinner and the external connection terminals can be placed closer to each other, so that the distribution unit can be formed more compact.

According to an eighth aspect of the invention, there is provided a distribution unit including a power circuit section including a plurality of bus bars with electronic parts mounted on at least some of the bus bars, a heat radiation member having a circuit disposition face on which the power circuit section is disposed, and a case for covering the power circuit section, characterized in that the ends of a plurality of specific bus bars included in the power circuit section are projected from the case to form external connection terminals, each of specific external connection terminals of the external connection terminals has an upright part rising from the circuit disposition face and an extension part extending from the tip of the upright part to the outside of the circuit disposition face roughly in parallel with the circuit disposition face, a different external terminal can be inserted into or removed from the external connection terminal through the tip part side of the extension part, and the external connection terminal is provided with a deflection regulation part for abutting the upright part for regulating deflection on the opposite side to the extension direction of the extension part.

According to the invention, the power circuit section includes the external connection terminals each having the upright part rising from the circuit disposition face of the heat radiation member and the extension part extending from the tip of the upright part to the outside of the circuit disposition face roughly in parallel with the circuit disposition face. Thus, to join an external terminal to the external connection terminal from the direction roughly parallel with the circuit disposition face, the extension part can be placed at a distance from the heat radiation member in the presence of the upright part and a short circuit in the extension part of the external connection terminal can be prevented reliably. The deflection regulation part is provided for abutting the upright part for regulating deflection on the opposite side to the extension direction of the extension part, so that deflection of the upright part caused by the external force (insertion force) acting on the extension part at the connecting time with a different external terminal can be regulated. That is, the external force (insertion force) acting on the extension part at the connecting time with the different external terminal can be substantially supported on the deflection regulation part. Therefore, the external force does not propagate to the power circuit section, the bus bar does not become deformed, and a gap is not formed between the power circuit section and the heat radiation member. If the different external terminal is joined to the external connection terminal from the direction roughly parallel with the circuit disposition face, the effect on the power circuit section can be suppressed. Moreover, deflection of the upright part is regulated, so that a situation in which deflection of the upright part causes the extension part to drop into the case can be circumvented reliably.

According to a ninth aspect of the invention, in the distribution unit as in the eighth aspect, the deflection regulation part is provided integrally with the case. In doing so, the external force acting on the extension part at the connecting time with a different external terminal can be distributed to the case, the durability of the deflection regulation part can be improved, and moreover the deflection regulation part can be placed at any desired position simply by assembling the case; the placement step of the deflection regulation part can be thus skipped for improving the manufacturing efficiency.

According to a tenth aspect of the invention, in the distribution unit as in the eighth or ninth aspect, at a tip part in the extension part of each of the specific external connection terminals, a tip slot part into which a different external terminal is inserted is formed along the extension direction of the extension part. In doing so, the tip slot part regulates the insertion direction of a different external terminal to the extension direction of the extension part, so that the insertion force produced by connection of the different external terminal can be reliably supported on the deflection regulation part.

DETAILED DESCRIPTION OF PREFERRED EMBODIMENTS

Referring now to the accompanying drawings, there are shown preferred embodiments of distribution units according to the invention. Here, distribution units each for distributing power supplied from a common power supply installed in a vehicle, etc., to a plurality of electric loads are shown, but the range of uses of the distribution units is not limited to it and the distribution units can be used in a wide range of applications.

FIRST EMBODIMENT

A distribution unit according to a first embodiment of the invention is provided mainly for preventing a short circuit between fuse connection terminals.

Figure 1:
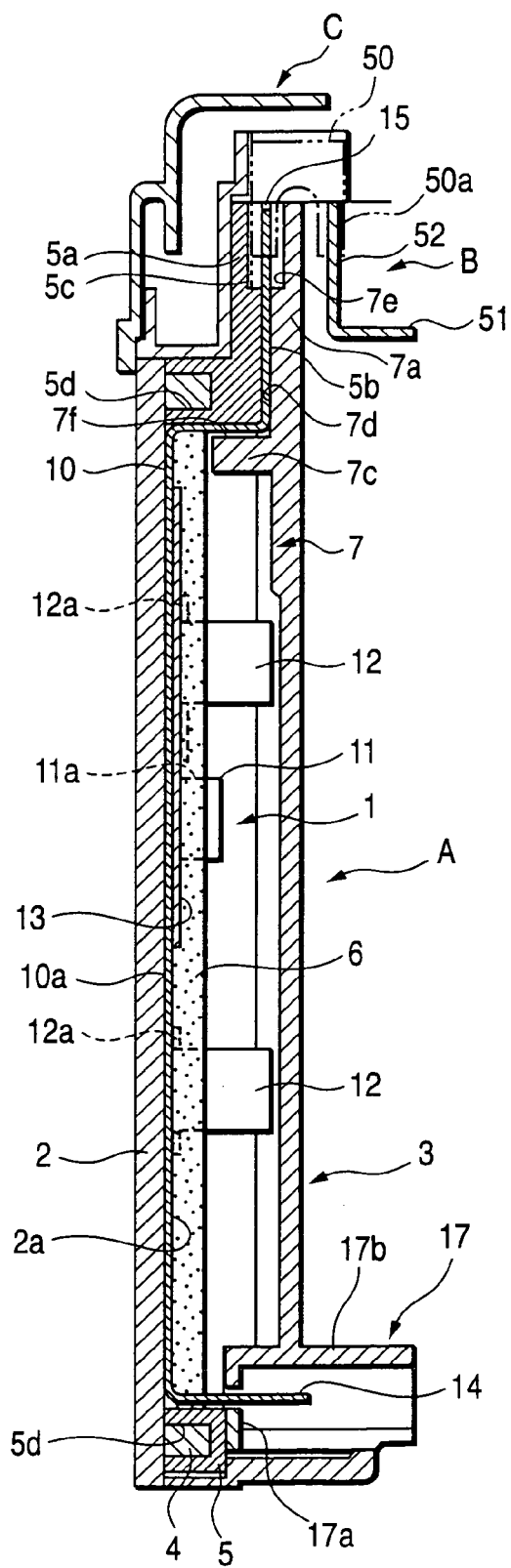
FIG. 1 is a sectional view to show a distribution unit of a first embodiment of the invention in a state in which the distribution unit is joined to bus bar boards (some not shown) by fuse elements.
Figure 2:
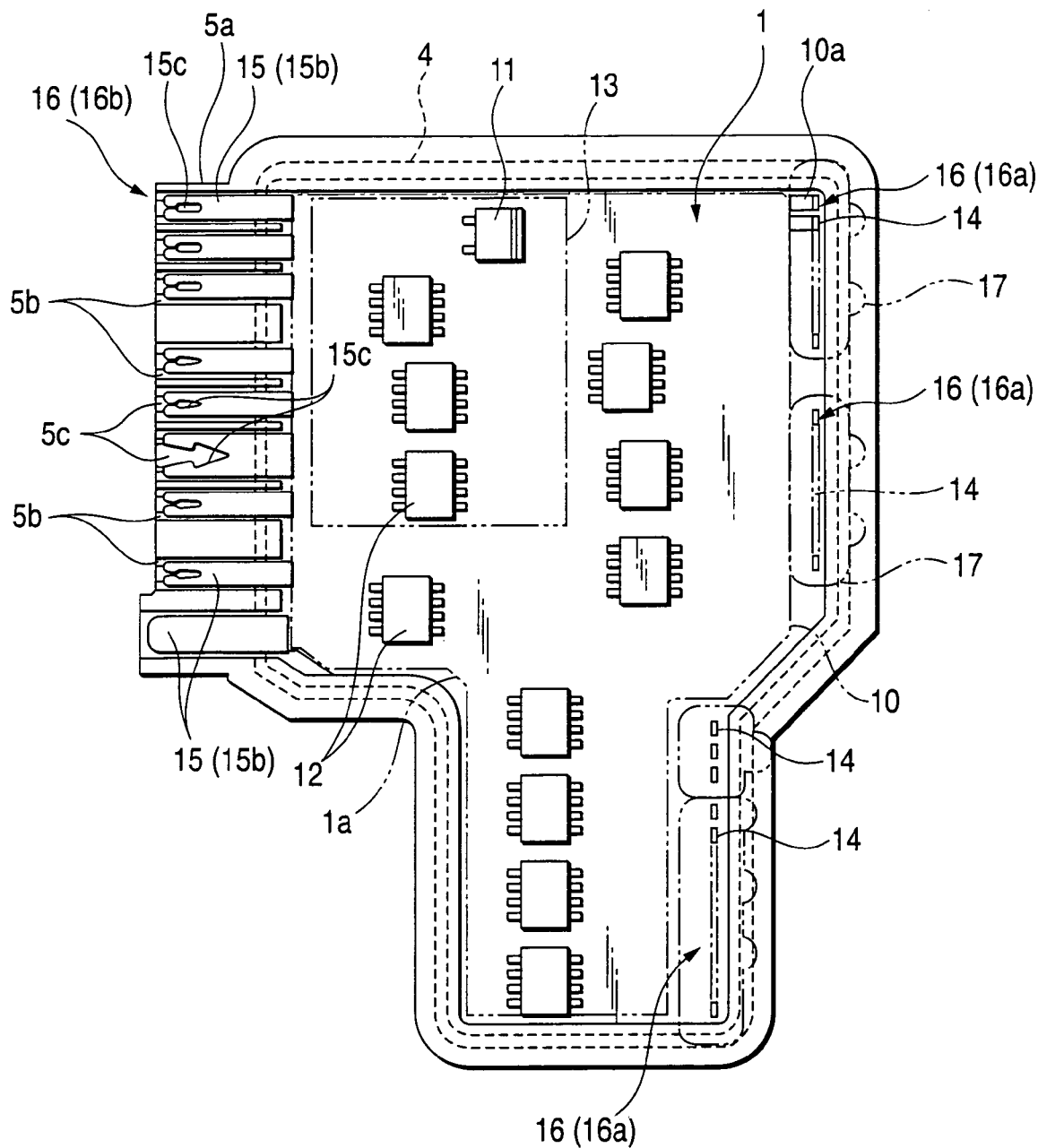
FIG. 2 is a plan view to show the distribution unit of the first embodiment of the invention in a state in which an upper case of the distribution unit is not shown.

FIG. 1 is a sectional view to show the distribution unit of the first embodiment in a state in which the distribution unit is joined to bus bar boards (some not shown) by fuse elements. FIG. 2 is a plan view to show the distribution unit in a state in which a power circuit section of the distribution unit is housed in a lower case of an insulating case (described later).

The distribution unit A is housed in an electric connection box not shown in the figure vertically, namely, is housed with the upper part in FIG. 1 upward in the first embodiment, but the placement direction of the distribution unit A is not limited to it; for example, the distribution unit A may be placed horizontally. In the description to follow, the directions when the distribution unit A is placed vertically may be used for convenience to identify the relative direction between the components of the distribution unit.

The distribution unit A of the first embodiment includes a power circuit section 1, a heat radiation member 2 having a circuit disposition face 2a on which the power circuit section 1 is disposed, and an insulting case 3 attached to the heat radiation member 2 so as to cover the power circuit section 1.

The power circuit section 1 includes a bus bar implementation board 10 having a plurality of bus bars 10a arranged in an area shaped like a predetermined polygon (lateral convex shape in the first embodiment) in a predetermined pattern in the same plane, in the first embodiment a pattern where the ends of the bus bars 10a are projected to both margins of the area (both upper and lower margins in FIG. 1), a plurality of FETs 11 (in the first embodiment, power MOSFETs) of electronic parts intervening between input terminal bus bars 10a and output terminal bus bars 10a of the bus bars 10a making up the bus bar implementation board 10, a plurality of relays 12 intervening between predetermined bus bars 10a, and a control circuit board 13 being bonded to one side of the bus bar implementation board 10 (in FIG. 1, the right side) and having a control circuit for controlling the switching operation of the FETs 11 and some relays 12, as shown in FIGS. 1 and 2. The FETs 11 and some relays 12 are mounted on both the bus bar implementation board 10 and the control circuit board 13, namely, are electrically connected thereto.

As shown in FIGS. 1 and 2, the FET 11 is shaped roughly like a rectangular parallelepiped and has a plurality of (in the first embodiment, two) pins 11a projected on one side, the pins being electrically connected to the bus bar implementation board 10 and the control circuit board 13. On the other hand, the relay 12 is shaped roughly like a rectangular parallelepiped and is formed at lower ends with a plurality of (in the first embodiment, eight) pins 11a projected on sides along the bus bar implementation board 10, the pins being electrically connected to the bus bar implementation board 10.

The power circuit section 1 is formed in both upper and lower margins with external connection terminals 14 and 15 provided by bending ends of specific bus bars 10a of the bus bars 10a to which external terminals are connected. In other words, the bus bars 10a are placed in a pattern such that the ends of the specific bus bars 10a are projected from a main body section 1a of the power circuit section 1, and the ends of the bus bars 10a of the bus bars 10a are bent, forming the external connection terminals 14 and 15. The main body section 1a of the power circuit section 1 refers to the portion of the power circuit section 1 contained in the area shaped like the predetermined polygon. The external connection terminals 14 and 15 function, for example, as input terminals connected to the vehicle-installed power supply (not shown), fuse connection terminals 15 connected through fuse elements 50 to a bus bar board B (described later), output terminals connected to various electronic units (not shown), signal input terminals for transmitting an operation control signal to the FETs 11, or the like; groups of the external connection terminals which are grouped by function are placed in rows in a state in which they are gathered in predetermined areas to form terminal assemblies 16.

Specifically, in the first embodiment, the ends of the specific bus bars 10a are folded up in the lower margin of the bus bar implementation board 10 to form the connector connection terminals 14 (first external connection terminals) projected to the right side in FIG. 1 (opposite side to the side of the heat radiation member 2 described later), and the connector connection terminals 14 are gathered in four predetermined areas to form first terminal assemblies 16a as shown in FIG. 2. In other words, the first terminal assembly 16a is made up of the connector connection terminals 14 placed in a row in a predetermined direction. On the other hand, the ends of the specific bus bars are bent each like a letter L in the upper end margin of the bus bar implementation board 10 to form the fuse connection terminals 15 (second external connection terminals) projected upward (in the direction along the circuit disposition face 2a), and the fuse connection terminals 15 are densely aggregated in one predetermined area to form a second terminal assembly 16b. The fuse connection terminal 15 has an upright part 15a rising from the circuit disposition face 2a and an extension part 15b extending from the tip of the upright part 15a to the outside of the circuit disposition face 2a almost in parallel with the circuit disposition face 2a.

The connector connection terminals 14 are surrounded by a connector female housing 17 formed in the insulating case 3 for each first terminal assembly 16a. On the other hand, the fuse connection terminal 5 is formed a placement part 15c to place a leg fuse element 50, as shown in FIG. 2. Particularly, the fuse connection terminals 15 include those having a bifurcated tip for easy insertion of the leg fuse element 50. The extension parts 15b include extension parts each having a tip part cut like a letter V along the extension direction of the extension part 15b to form a tip slot part 15c into which a terminal 50a of the leg fuse element 50 can be inserted from the extension direction of the extension part 15b. That is, the second external connection terminals 15 correspond to external connection terminals.

The external connection terminals 14, 15 are not limited to those formed by bending as in the first embodiment, they may be extended linearly from the power circuit section 1 along the circuit disposition face 2a (described later). The shape of the bus bar implementation board 10 and the placement pattern of the bus bars 10a are not limited and the FETs 11 and the relays 12 can also be replaced with other electronic parts such as an LSI and a thyristor. Further, the control circuit board 13 can also be changed so that it is placed above the FET 11.

The heat radiation member 2 has a lateral convex plate shape; for example, the whole is formed of a material having excellent thermal conductivity such as aluminum-based metal and the top face is formed as the flat circuit disposition face 2a. A circuit disposition area in which the power circuit section 1 is disposed is provided on the circuit disposition face 2a, and an insulating layer (not shown) is provided so as to extend off the area. That is, the power circuit section 1 is disposed via the insulating layer on the circuit disposition face 2a of the heat radiation member 2. The insulating layer is thermally connected to the heat radiation member 2; for example, it is formed by applying and drying an adhesive having high insulting properties (for example, an adhesive made of an epoxy-based resin, a silicone-based adhesive, etc.,) or by putting an insulating sheet on the circuit disposition face 2a. The insulating layer may be of a single-layer structure or a multi-layer structure.

The heat radiation member 2 may be formed by projecting a heat radiation fin, a heat radiation pin, etc., on the opposite side to the circuit disposition face 2a for enhancing the heat radiation efficiency. Further, the heat radiation fin, the heat radiation pin, etc., may be formed with asperities for enhancing the heat radiation efficiency.

The insulating case 3 is provided for covering the power circuit section 1 to provide the insulating properties of the power circuit section 1, and is opened in the projection direction of the fuse connection terminals 15 so that the fuse terminal 50 can be placed from the outside of the insulating case 3 in the tip placement part 15c of the fuse connection terminal 15 of the power circuit section 1. In the first embodiment, the insulating case 3 is formed of an insulating material and includes a lower case 5, an upper case 7, and a seal member 4 disposed on the lower end face of the lower case 5.

The lower case 5 has a lower side flange part 5a projected upward in the margin on the opposite side to the heat radiation member 2 side, and the lower side flange part 5a is provided with a lower side guide groove 5b (terminal guide groove) for individually guiding the fuse connection terminal 15, as shown in FIGS. 1 and 2. The lower side guide groove 5b has a width and a length provided corresponding to the extension part 15b of the fuse connection terminal 15. Therefore, the extension part 15b of the fuse connection terminal 15 is housed in the lower side guide groove 5b, and a portion of the extension part 15b, facing the heat radiation member 2 side, is covered by the cover. Almost at the center of the lower side guide groove 5b in the width direction thereof, a pin retention groove 5c is provided along the length direction. A pin 50a of the fuse element 50 (described later) is inserted into the pin retention groove 5c, and the length of the pin retention groove 5c is set appropriately in response to the pin 50a.

The lower case 5 has a lower side flange part 5a projected upward in the margin on the opposite side to the heat radiation member 2 side, and the lower side flange part 5a is provided with a lower side guide groove 5b (terminal guide groove) for individually guiding the fuse connection terminal 15, as shown in FIGS. 1 and 2. The lower side guide groove 5b has a width and a length provided corresponding to the extension part 15b of the fuse connection terminal 15. Therefore, the extension part 15b of the fuse connection terminal 15 is housed in the lower side guide groove 5b and the half face of the extension part 15b (the half face on the heat radiation member 2 side) is covered. Almost at the center of the lower side guide groove 5b in the width direction thereof, a pin retention groove 5c is provided along the length direction. A pin 50a of the fuse element 50 (described later) is inserted into the pin retention groove 5c, and the length of the pin retention groove 5c is set appropriately in response to the pin 50a.

The lower case 5 is attached via the seal member 4 to the circuit disposition area of the heat radiation member 2, and a seal member fill groove 5d filled with the seal member 4 is formed on the end face on the heat radiation member 2 side.

The seal member 4 is formed like perimeter shape surrounding the circuit disposition area and can be hermetically fitted into the seal member fill groove 5d. The seal member 4 is provided for temporarily preventing a liquid insulating resin (described later) from leaking from the lower case 5 until the insulating resin hardens and therefore the seal member 4 does not require durability over a long term and can use a comparatively inexpensive material. The seal member 4 is not limited; a material having given elasticity, for example, expanded rubber is used preferably from the viewpoint of reliably closing the gap between the lower case 5 and the heat radiation member 2. The material used for the seal member 4 is not limited either; preferably chloroprene rubber, etc., is used from the viewpoint of cost efficiency, universal use, workability, etc.

Figure 3:
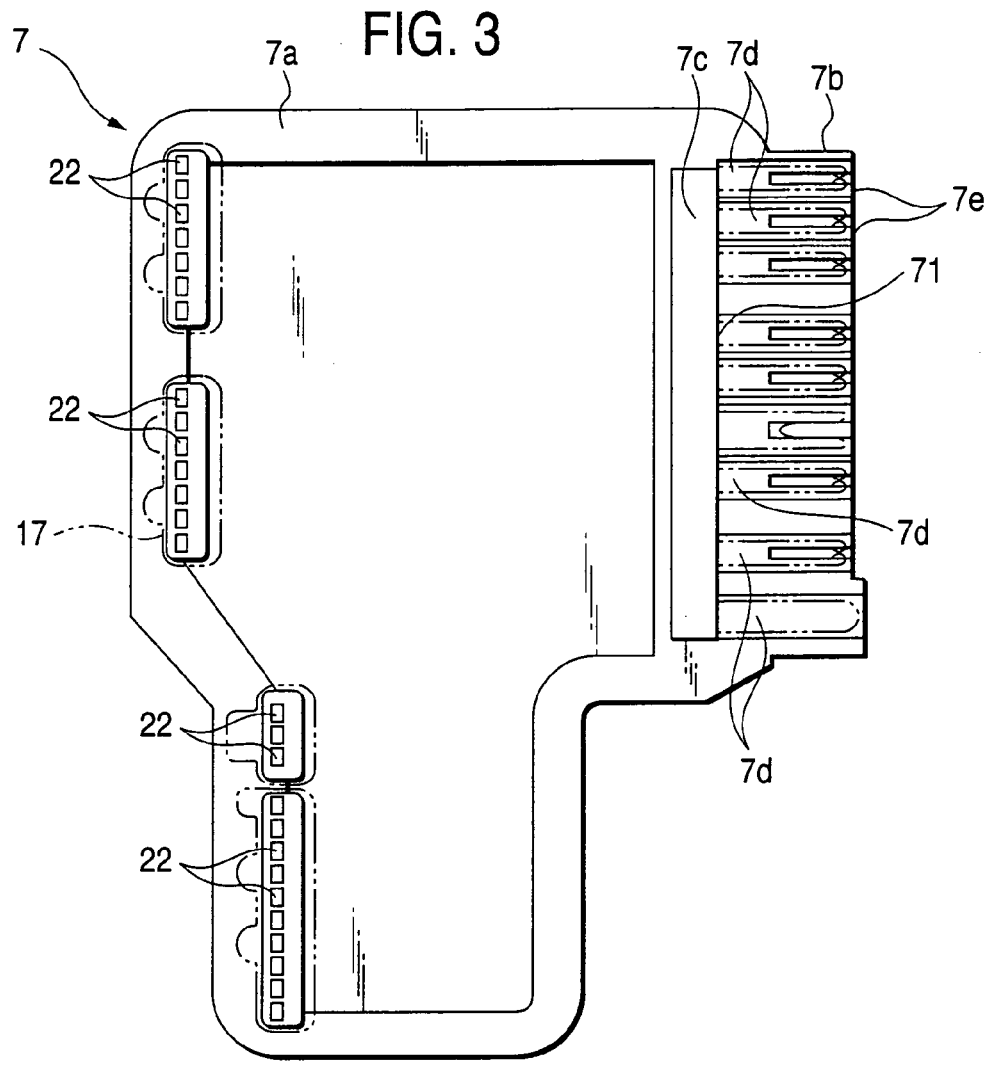
FIG. 3 is a rear view to show an upper case of the distribution unit of the first embodiment of the invention.

On the other hand, the upper case 7 has a lateral convex plate shape corresponding to the upper end opening of the lower case 5 and is formed with the inner center made concave as shown in FIGS. 1 and 3. The upper case 7 includes an upper case main body 7a, an upper side flange part 7b provided in the upper end margin of the upper case main body 7a and superposed on the lower side flange part 5a of the lower case 5, a deflection regulation part 7c projecting from the inner surface of the upper case towards the heat radiation member 2 side and being located along the side of the electric connection box containing connection terminals 15, and the above-mentioned connector female housing 17 projecting from the outer surface of the upper case away from the heat radiation member 2 side and being located along the side of the electric connection box containing terminals 14.

The upper side flange part 7b has an outer face formed flush with the upper case main body 7a and has an inner face provided with an upper side guide groove 7d for guiding the fuse connection terminal 15 along the projection direction of the upper side flange part 7b. Like the lower side guide groove 5b, the upper side guide groove 7d also has a width and a length provided corresponding to the extension part 15b of the fuse connection terminal 15. When the extension part 15b of the fuse connection terminal 15 is housed in the upper side guide groove 7d, the half face of the extension part 15b (the half face on the opposite side to the heat radiation member 2) is covered.

Figure 4:
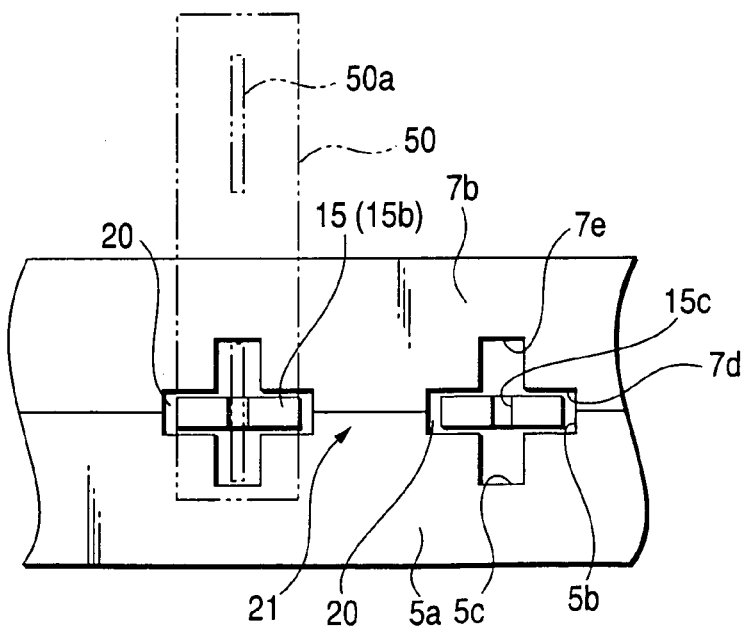
FIG. 4 is a top view to show the connection structure of fuse connection terminals of the distribution unit of the first embodiment of the invention.

Therefore, as the lower case 5 and the upper case 7 are assembled, the upper side guide groove 7d and the lower side guide groove 5b form terminal insertion holes 20 for individually inserting the fuse connection terminals 15, as shown in FIG. 4. The insulating case 3 portion between the terminal insertion holes 20 corresponds to a short-circuit prevention section 21. That is, the short-circuit prevention section 21 in the first embodiment is formed integrally with the lower case 5 and the upper case 7 and is provided by combining the lower case 5 and the upper case 7. Almost at the center of the upper side guide groove 7d in the width direction thereof, a pin retention groove 7e is also provided along the length direction as with the lower side guide groove 5b.

Figure 12:
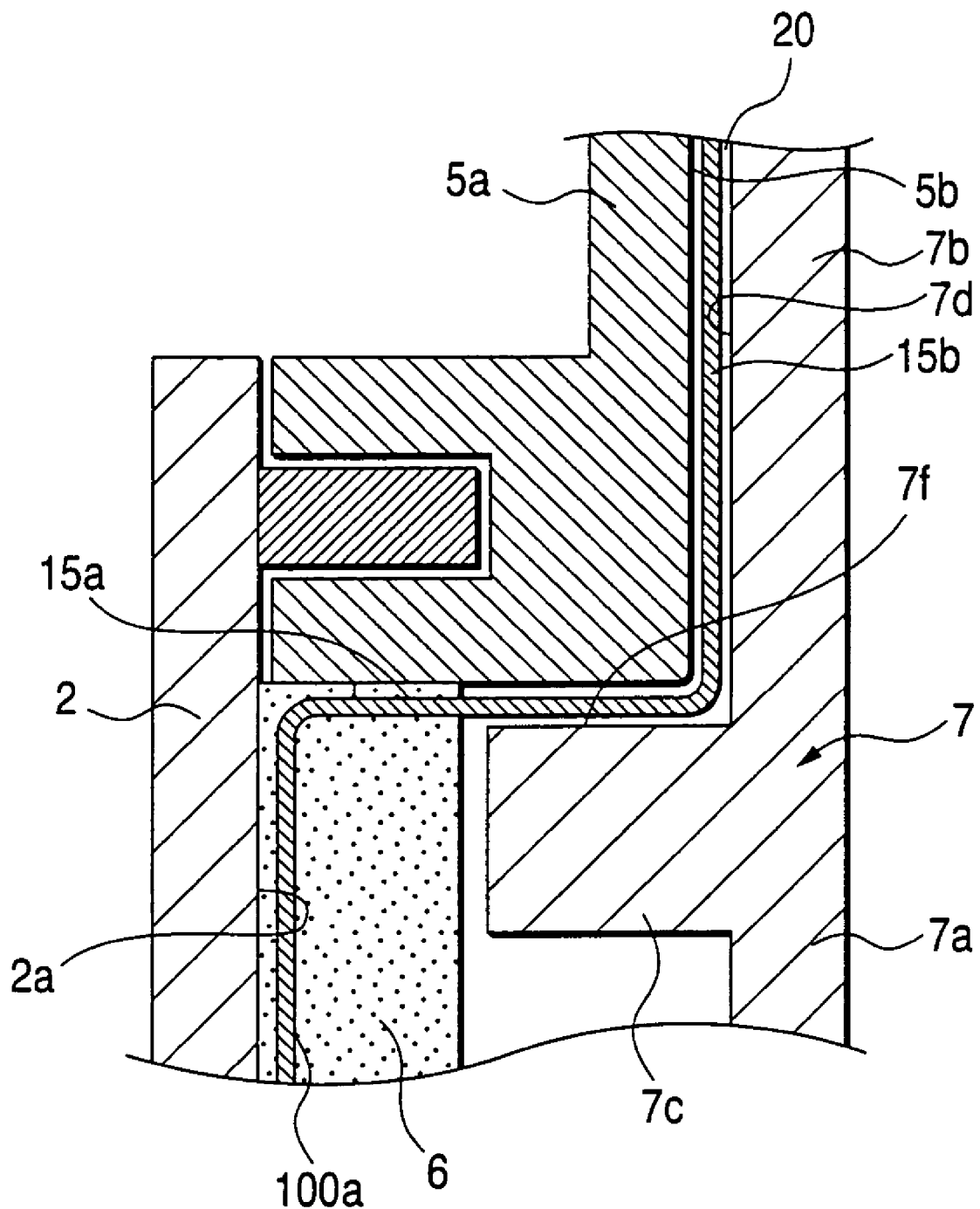
FIG. 12 is an enlarged sectional view to show the periphery of a deflection regulation part in FIG. 1.

The deflection regulation part 7c regulates deflection of the upright part 15a as the extension part 15b is pushed when any other terminal such as external terminal is connected to the fuse connection terminal 15. The deflection regulation part 7c is projected to the left side in the inner face of the upper case 7. The deflection regulation part 7c is placed in a state in which a face 7f opposed to the upright part 15a of the fuse connection terminal 15 abuts or is a little distant from the upright part 15a with the upper case 7 fitted into the lower case 5 housing the power circuit section 1, as shown in FIGS. 1 and 12. That is, the deflection regulation part 7c is provided so as to support the upright part 15a of the fuse connection terminal 15 at a position opposite to the extension direction of the extension part 15b. In the first embodiment, one continuous deflection regulation part 7c is provided for a plurality of fuse connection terminals 15, as shown in FIGS. 3 and 12; however, deflection regulation parts may be provided in a one-to-one correspondence with the fuse connection terminals 15. The deflection regulation part 7c need not be provided for all fuse connection terminals 15 and can be skipped for some of them as required. The deflection regulation part 7c is roughly rectangular in cross section.

The connector female housing 17 is provided corresponding to the first terminal assembly 16a made up of the connector connection terminals 14. That is, at the lower end of the upper case main body 7a, to project each connector connection terminal 14 from the insulating case 3, terminal through holes 22 are provided in rows in a one-to-one correspondence with the connector connection terminals 14 along the lower margin of the upper case main body 7a. The tubular female housing 17 is provided so as to surround the terminal through holes 22 for each first terminal assembly 16a. The connector connection terminals 14 can be projected through the terminal through holes 22 into the female housing 17. The female housing 17 and the connector connection terminals 14 make up an external connection connector that can be coupled to another connector having a male housing.

Next, assembling the described distribution unit A will be discussed.

To begin with, the seal member 4 is filled hermetically into the seal member fill groove 5d of the lower case 5 and then the lower case 5 is attached to the heat radiation member 2 with the seal member 4 brought into intimate contract with the top of the circuit disposition face 2a surrounding the circuit disposition area of the heat radiation member 2. To attach the lower case 5 to the heat radiation member 2, a known attachment method of attaching proper parts of the lower case 5 with mechanical fixing parts of screws, bolts, etc., or an adhesive or the like, for example, is adopted. To use a resin having an adhesive property as insulating resin described later, the lower case 5 may be attached to the heat radiation member 2 by temporary tacking.

The power circuit section 1 is disposed in the circuit disposition area surrounded by the lower case 5. Specifically, while the fuse connection terminals 15 are housed in the lower side guide groove 5b of the lower case 5, the power circuit section 1 is bonded with an adhesive having high thermal conductivity, for example, or if a component to be grounded in the bus bar 10a is contained, the bus bar 10a is screwed into the heat radiation member 2, whereby the power circuit section 1 is disposed in the circuit disposition area on the circuit disposition face 2a of the heat radiation member 2 via the insulating layer.

Here, to adopt an adhesive to attach the power circuit section 1 to the circuit disposition area of the heat radiation member 2, preferably the same adhesive as the adhesive forming the insulating layer (in the embodiment, adhesive made of epoxy-based resin) is used. That is, for example, if a pin hole occurs when the insulting layer is formed, the pin hole is filled up in the applying work of the adhesive and the adhesive for bonding the power circuit section 1 forms a part of the insulting layer, so that the power circuit section 1 and the heat radiation member 2 can be reliably insulated from each other.

In this state, a predetermined amount of liquid insulating resin is filled into the space surrounded by the lower case 5 and the insulating resin is hardened to form the insulating layer 6. This insulating layer 6 is formed to the height for sealing the bus bar implementation board 10 and the control circuit board 13 except the first terminal assemblies or the fuse connection terminals 15 and sealing at least the pins of the various electronic parts 11 and 12 mounted on the power circuit section 1. As the insulating layer 6 is thus formed, if the bus bars 10a forming the power circuit section 1 are placed near to each other, a short circuit between the bus bars 10a can be prevented reliably. If a resin having water resistance, such as a silicone-based resin, is adopted as the insulating resin, a short circuit caused by water drops, etc., can also be prevented reliably and the leakage characteristic in the power circuit section 1 is improved still more. The deflection regulation part 7c provided in the upper case 7 is positioned on the opposite side to the extension direction of the extension part 15b in the upright part 15a of the second external connection terminal 15 for regulating deflection of the upright part 15a.

The upper case 7 is attached with the upper end opening of the lower case 5 covered. Specifically, the upper case 7 is attached to the lower case 5 with retention members of retention pieces, etc., (not shown) or by bonding, adhesion, welding, etc. At this time, the connector connection terminals 14 of the power circuit section 1 are projected through the terminal through holes 22 of the upper case 7 into the female housing 17; on the other hand, each fuse connection terminal 15 has the extension part 15b inserted into the corresponding terminal insertion hole 20. The deflection regulation part 7c provided in the upper case 7 is positioned on the opposite side to the extension direction of the extension part 15b in the upright part 15a of the second external connection terminal 15 for regulating deflection of the upright part 15a.

Thus, in the distribution unit A, the power circuit section 1 is disposed on the circuit disposition face 2a of the heat radiation member 2 via the insulating layer, and the insulating case 3 is attached to the heat radiation member 2 so as to cover the power circuit section 1. Specifically, each fuse connection terminal 15 has the extension part 15b inserted into the corresponding terminal insertion hole 20 of the insulating case 3 and the portion between the terminal insertion holes 20 in the insulating case 3 is formed as the short-circuit prevention section 21 between the extension parts 15b of the fuse connection terminals 15 making up one second terminal assembly 16b for reliably preventing a short circuit between the extension parts 15b of the adjacent fuse connection terminals 15.

The upper case 7 of the insulating case 3 is provided with the deflection regulation part 7c for supporting the upright part 15a of the fuse connection terminal 15 from the opposite side to the extension direction of the extension part 15b, preventing the upright part 15a of the fuse connection terminal 15 from being deflected to prevent the extension part 15b from being slip through the terminal through holes 22.

In the distribution unit A assembled as described above, the short-circuit prevention section 21 as a part of the insulating case 3 intervenes between the fuse connection terminals 15 as an assembly, so that a short circuit between the external connection terminals of the first, second terminal assembly is prevented effectively. Therefore, the leakage characteristic between the first, the fuse connection terminals 14, 15 can be improved according to the simple configuration. As the leakage characteristic is thus improved, the first, the fuse connection termination 14, 15 can be densely aggregated and the distribution unit A can be formed more compact.

The distribution unit A is housed in an electric connection box (not shown) and is electrically connected through the fuse element 50 to a bus bar 51 of the bus bar board B housed in the electric connection box. That is, the bus bar board B is made up of alternate layers of bus bar layers made of metal plates and insulating layers made of insulating plates and is provided in the periphery with bus bar board side fuse connection terminal 51 connected to the fuse connection terminal 15 of the distribution unit A. The bus bar board side fuse connection terminal 51 and the fuse connection terminal 15 as unit side fuse connection terminal are placed side by side so as to project substantially in the same direction, and the fuse element 50 is placed so as to straddle the fuse connection terminals 51 and 15. Thus, in the electric connection box of the first embodiment, the fuse element 50 is placed saddling the unit side fuse connection terminal 15 and the bus bar board side fuse connection terminal 51, so that the occupation area of the bus bar board itself can also be reduced as compared with the case where all fuse elements are assembled on the board. Since the fuse connection terminal 15 and the bus bar board side fuse connection terminal 51 are electrically connected through the fuse element 50, the number of connection parts decreases and the structure is simplified and the connection reliability is enhanced accordingly as compared with the case where bus bar terminals are abutted against each other and are joined aside from the disposition part of the fuse element 50.

In the distribution unit A, the power circuit section 1 is disposed on the circuit disposition face 2a of the heat radiation member 2 via the insulating layer, and the case 3 is attached to the heat radiation member 2 so as to cover the power circuit section 1. The power circuit section 1 is provided with the second external connection terminals 15 each having the upright part 15a and the extension part 15b. Thus, to join the terminal 50a of the fuse element 50 to the second external connection terminal 15 from the direction roughly parallel with the circuit disposition face 2a, the extension part 15b can be placed at a distance from the heat radiation member 2 in the presence of the upright part 15a and a short circuit in the extension part 15b of the second external connection terminal 15 can be prevented reliably. The tip slot part 15c is provided at the tip part of the extension part 15b of the second external connection terminal 15 and the terminal 50a of the fuse element 50 can be inserted into the tip slot part 15c. On the other hand, the upper case 7 of the case 3 is provided with the deflection regulation part 7c for supporting the upright part 15a of the second external connection terminal 15 from the opposite side to the extension direction of the extension part 15b, preventing the upright part 15a of the second external connection terminal 15 from being deflected when the terminal 50a of the fuse element 50 is inserted to prevent the power circuit section 1 from being strip from the circuit disposition face 2a of the heat radiation member 2. That is, the external force (insertion force) acting on the extension part 15b at the connecting time with the terminal 5a of the fuse element 50 can be substantially supported on the deflection regulation part 7c. Therefore, the external force does not propagate to the power circuit section 1, the bus bar 1a does not become deformed, and a gap is not formed between the power circuit section 1 and the heat radiation member 2. If the fuse element 50 is joined to the second external connection terminal 15 from the direction roughly parallel with the circuit disposition face 2a, the effect on the power circuit section 1 can be suppressed. Moreover, deflection of the upright part 15a is regulated, so that a situation in which deflection of the upright part 15a causes the extension part 1b to drop into the case 3 can be circumvented reliably.

Although the distribution unit A according to the first embodiment has been described, it is to be understood that the distribution unit A according to the invention is not limited to the first embodiment and various modifications can be made without departing from the spirit and the scope of the invention. For example, the following modifications can be made:

(1) In the first embodiment, the fuse connection terminals 15 are inserted into the terminal insertion holes 20 made in the insulating-case 3 and the portion between the terminal insertion holes 20 in the insulating case 3 functions as the short-circuit prevention section, but the specific structure of the short-circuit prevention section is not limited. For example, the insulating case 3 may be formed with a terminal insertion groove in place of the terminal insertion holes 20 and the fuse connection terminals may be inserted along the bottom of the terminal insertion groove. However, if the fuse connection terminals 15 are inserted into the terminal insertion holes 20 as in the first embodiment, the outer periphery of each fuse connection terminal 15 is taken into the corresponding part of the insulating case and thus a short circuit can be prevented more reliably.

(2) In the first embodiment, the lower case 5 may be formed in the inner face of the peripheral wall with a plurality of upright part housing grooves communicating with the lower side guide groove 5b and the upright parts 15a of the fuse connection terminals 15 may be housed in the upright part housing grooves individually. In doing so, if the upright parts 15a of the fuse connection terminals 15 are placed near to each other, a short circuit between the adjacent upright parts can be prevented reliably and the leakage characteristic is improved still more.

(3) In the first embodiment, the insulating case 3 is divided into the lower case 5 and the upper case 7, which are combined to form the terminal insertion holes 20, but the specific structure of the insulating case 3 is not limited. For example, an insulting case formed in one piece may be used. However, in the configuration as in the first embodiment, the fuse connection terminals 15 can be easily inserted into the terminal insertion holes 20 simply by combining the lower case 5 and the upper case 7 with the fuse connection terminals 15 housed in the terminal guide groove 5b of the lower case 5 and the terminal guide groove 7d of the upper case 7, so that the assembling work is facilitated.

(4) In the case where the insulating case 3 is divided as in the first embodiment, the terminal guide groove 5b, 7d may be provided in either of the lower case 5 and the upper case 7 rather than both of them and the lower case 5 and the upper case 7 may be combined to form the terminal insertion holes.

(5) In the embodiment, one continuous formed deflection regulation part 7c is provided for a plurality of second external connection terminals 15: however, deflection regulation parts may be provided in a one-to-one correspondence with the second external connection terminals 15.

(6) In the description of the embodiment, the deflection regulation part 7c is provided integrally with the upper case 7, but may be provided separately from the upper case. For example, after the power circuit section 1 is disposed in the lower case 5, the deflection regulation part for supporting the upright part 15a of the second external connection terminal 15 may be attached to the lower case 5. However, as the deflection regulation part is provided integrally with the upper case, the external force acting on the extension part at the connecting time with another external terminal can be distributed to the case, the durability of the deflection regulation part can be improved, and moreover the deflection regulation part can be placed at any desired position simply by assembling the case; the placement step of the deflection regulation part can be thus skipped for improving the manufacturing efficiency.

SECOND EMBODIMENT

A distribution unit according to a second embodiment of the invention is provided entirely for preventing a short circuit between connector connection terminals.

Figure 5:
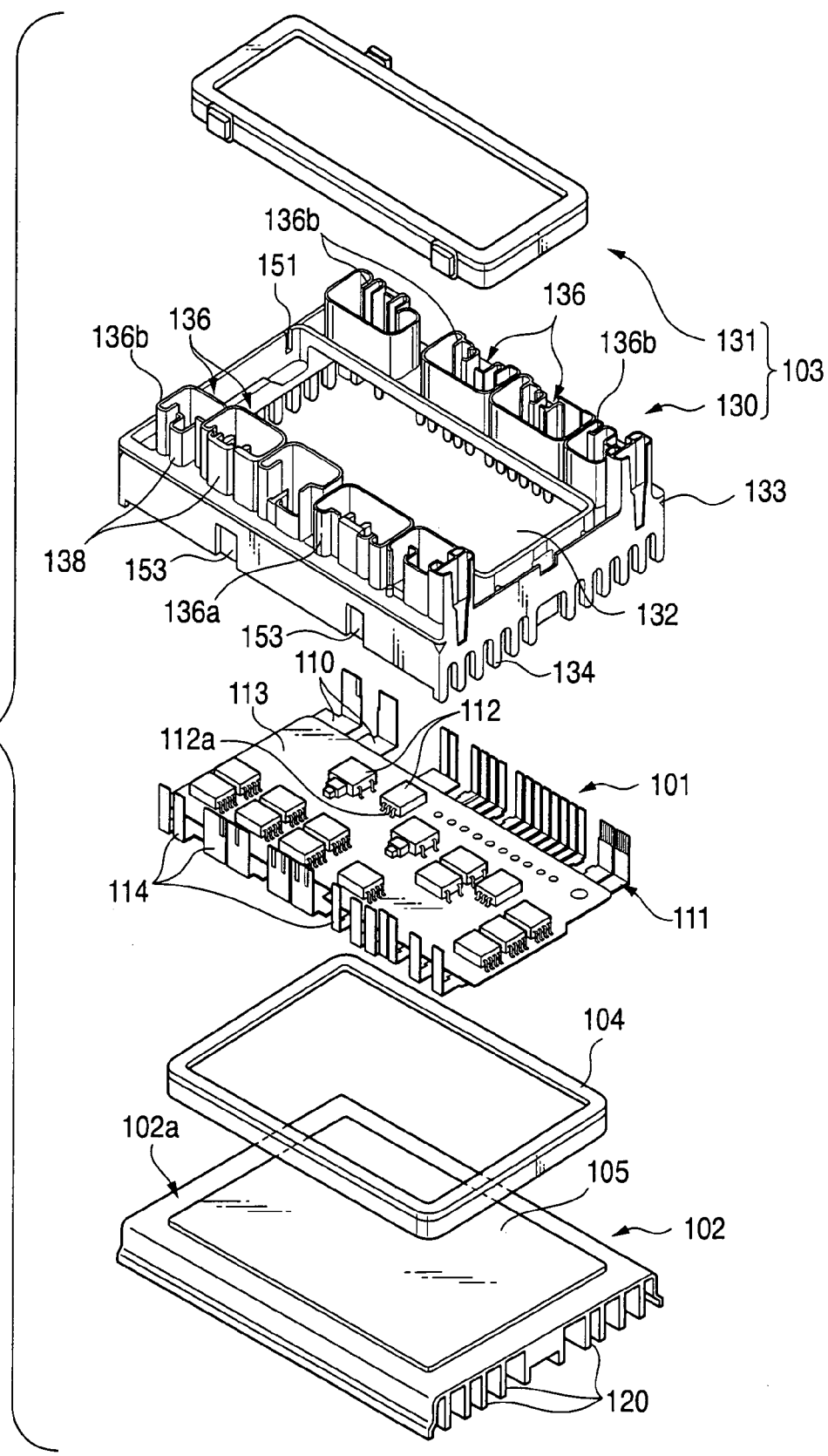
FIG. 5 is an exploded perspective view to show a distribution unit according to a second embodiment of the invention.
Figure 7:
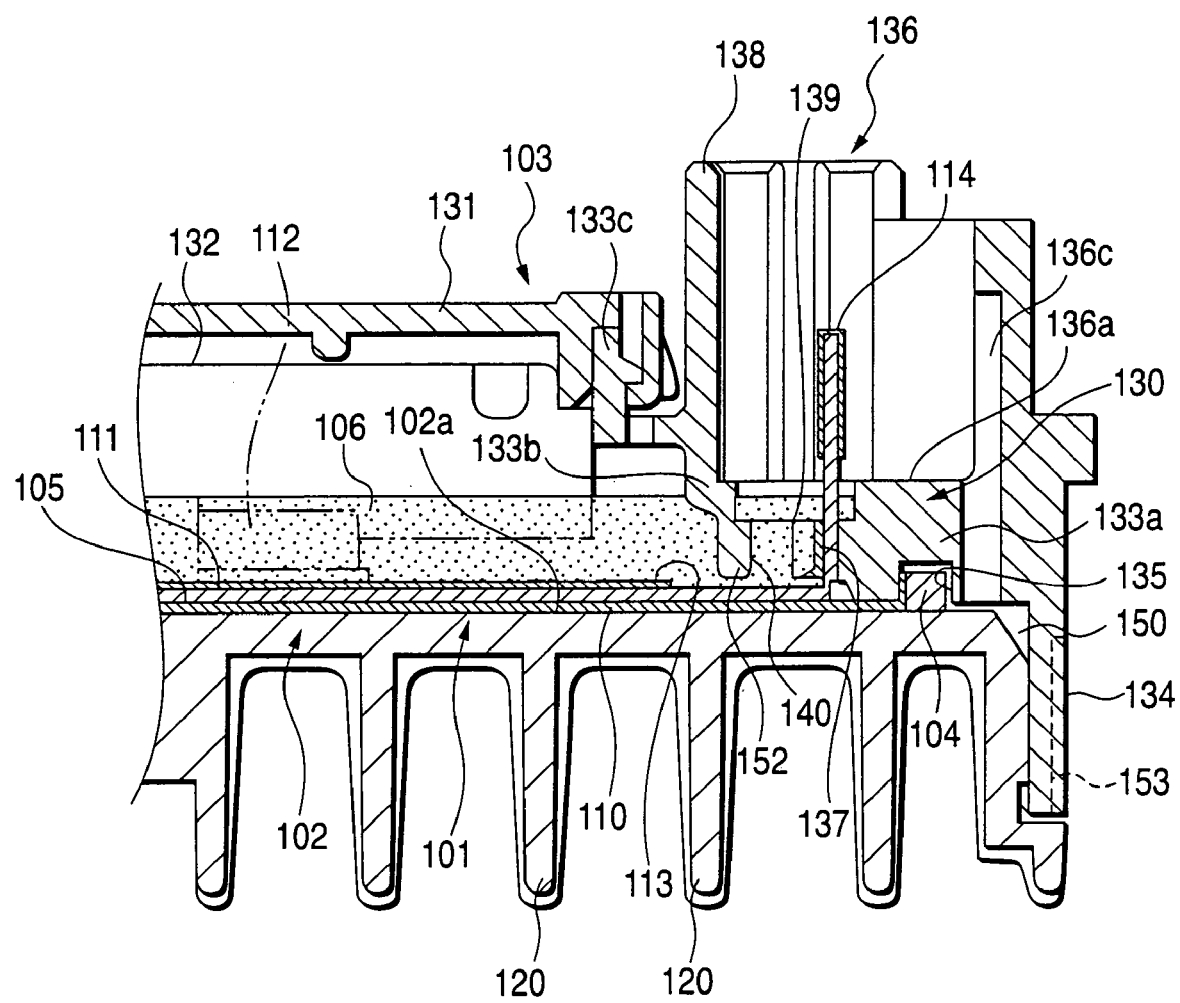
FIG. 7 is a sectional view of the main part of the distribution unit of the second embodiment of the invention.

FIG. 5 is an exploded perspective view to show the distribution unit according to the second embodiment. The distribution unit includes a power circuit section 101 containing a plurality of bus bars 110, a heat radiation member 102 on which the power circuit section 101 is disposed via an insulating layer 105, and a case 103 to cover the power circuit section 101. As shown in FIG. 7, the case 103 and the heat radiation member 102 are joined to each other with a resin seal member 104 provided in the case 103 sandwiched between the case 103 and the heat radiation member 102 and in this state, a water resistance resin is filled to form a water resistance layer 106.

The power circuit section 101 includes a bus bar implementation board 111 having a plurality of bus bars 110 arranged in an area shaped like a predetermined polygon (rectangle in the second embodiment) in a predetermined pattern in the same plane, in the second embodiment a pattern where the ends of the bus bars 110 are projected to both margins of the area (both left and right margins in FIG. 5), a plurality of FETs 112 of semiconductor switching elements intervening between input terminal bus bars and output terminal bus bars of the bus bars 110, and a control circuit board 113 being bonded to one side of the bus bar implementation board 111 (in FIG. 1, the top) and having a control circuit for controlling the switching operation of the FETs 112. The FETs 112 are mounted on both the bus bar implementation board 111 and the control circuit board 113, namely, are electrically connected thereto.

Thus, in the power circuit section 101, the bus bar implementation board 111 and the control circuit board 113 are directly joined to each other and the FETs 112 are electrically connected to the bus bar implementation board 111 and the control circuit board 113, so that the power circuit section 101 can be formed compact particularly in the thickness direction.

As shown in FIG. 5, ends of predetermined bus bars 110 in the bus bar implementation board 111 are folded up each to a predetermined shape to form external connection terminals 114. In the second embodiment, the ends of the bus bars 110 projected to both left and right margins of the roughly rectangular plane area where the bus bars 110 are arranged are, folded up roughly, perpendicularly to the plane to form the external connection terminals 114. The external connection terminals 114 function, for example, as input terminals connected to a common vehicle-installed power supply, output terminals connected to electronic units, or signal input terminals for inputting a control signal involved in the switching operation of the FETs 112.

Figure 11:
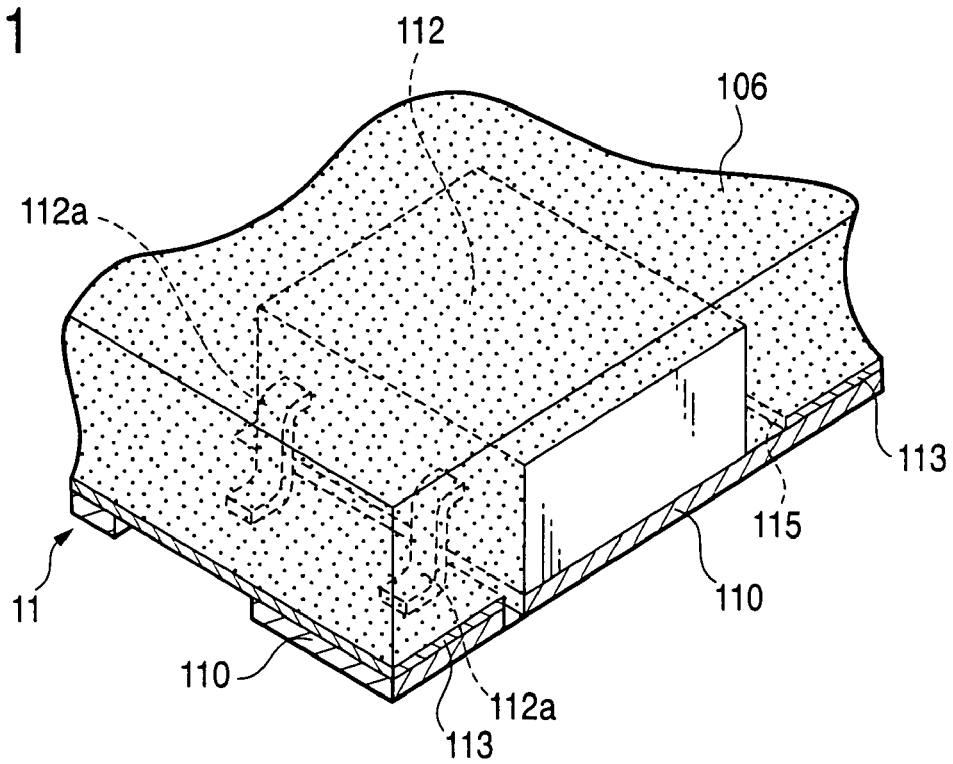
FIG. 11 is a perspective view to show an FET with its pins sealed with a water resistance resin.

As shown in FIGS. 5 and 11, the FET 112 is shaped roughly like a rectangular parallelepiped and has a plurality of (in the first embodiment, two) pins 112a projected on one side, the pins being electrically connected to the bus bar implementation board 111 and the control circuit board 113. Specifically, the FET 112 has source terminal and drain terminal connected to the bus bar 110 and gate terminal connected to the control circuit board 113.

The control circuit board 113 is implemented as a usual printed circuit board, for example: in the second embodiment, a thin sheet-like printed circuit board is used. The control circuit board 113 is formed with through holes 115 at predetermined positions (see FIG. 11), and the FETs 112 are mounted on the bus bars 110 through the through holes 115.

The shape of the bus bar implementation board 111 and the placement pattern of the bus bars 110 can be changed appropriately, and other electronic parts having pins such as an LSI and a thyristor can also be used in addition to or place of the FETs 112. Further, the control circuit board 113 can also be changed so that it is placed above the FET 112.

Figure 6:
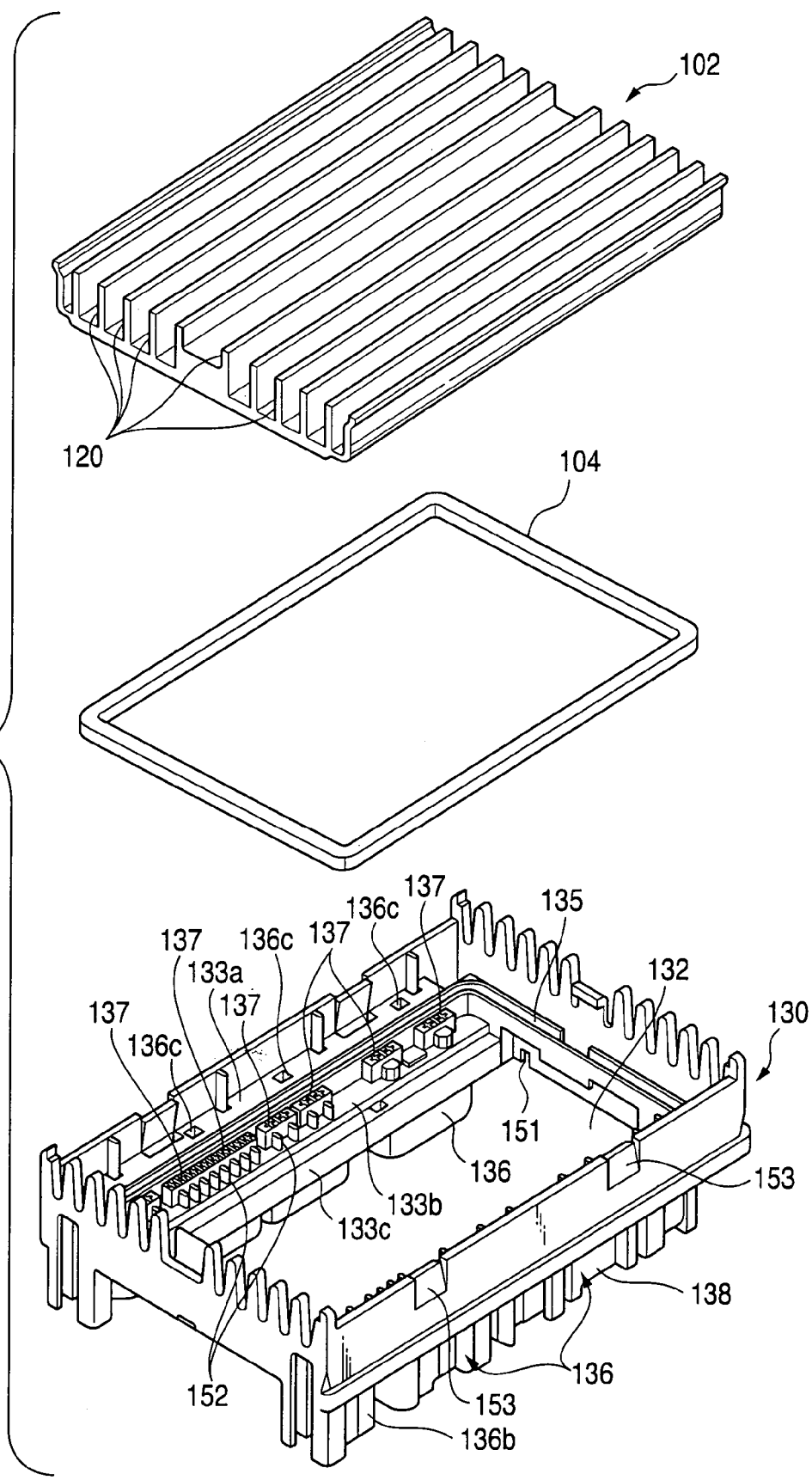
FIG. 6 is a perspective view when a surround wall member, a resin seal member, and a heat radiation member in the distribution unit of the second embodiment of the invention are seen from the opposite side to that in FIG. 5.

For example, the whole of the heat radiation member 102 is formed of a material having excellent thermal conductivity such as aluminum-based metal shaped roughly like a rectangle on plan view and the top face is formed as a flat circuit disposition face 102a and a plurality of heat radiation fins 120 arranged from side to side are projected downward from the lower face of the heat radiation member 102, as shown in FIGS. 5 and 6. A circuit disposition area in which the power circuit section 101 is disposed is provided on the circuit disposition face 102a, and the insulating layer 105 is provided in a state in which it extends off the area. The insulating layer 105 is thermally connected to the heat radiation member 102; for example, it is formed by applying and drying an adhesive having high insulting properties (for example, an adhesive made of an epoxy-based resin, a silicone-based adhesive, etc.,) or by putting an insulating sheet on the circuit disposition face 102a. In the second embodiment, an adhesive made of an epoxy-based resin having excellent insulting properties and thermal conductivity is applied to form the insulating layer 105.

The heat radiation fins 120 can be omitted as required or may be replaced with heat radiation pins, etc., projected to the opposite side to the circuit disposition face 102a. The heat radiation fins, heat radiation pins, etc., may be formed on surfaces with narrow grooves, etc., for enlarging the surface areas to enhance the heat radiation efficiency.

The case 103 is made of an insulating material and includes a surround wall member 130 formed like a tubular shape and a lid 131 for closing an upper end opening 132 of the surround wall member 130, as shown in FIGS. 5 and 6.

The surround wall member 130 has wall parts 133 with lower end faces along the fringes of the circuit disposition face 102a, a skirt section 134 being extended downward from the fringes of the wall parts 133 for covering the peripheral sides of the heat radiation member 102, and the above-mentioned resin seal member 104 disposed on the lower end faces of the wall parts 133, as shown in FIGS. 5 to 7, so that the surround wall member 130 can surround the power circuit section 101, in other words, the circuit disposition area of the heat radiation member 102.

The wall parts 133 are shaped so as to surround the circuit disposition area of the heat radiation member 102; each wall part 133 includes a first vertical wall part 133a, a horizontal wall part 133b extending to the inside from the tip margin of the first vertical wall part 133a, and a second vertical wall part 133c extending upward (opposite side to the heat radiation member 102) from the tip margin of the horizontal wall part 133b, and a seal member fill groove 135 is formed fully over the lower end face of the first vertical wall part 133a, as shown in FIG. 7. That is, the seal member fill groove 135 is provided so as to surround the circuit disposition area of the circuit disposition face 102a and is filled with the resin seal member 104. The seal member fill groove 135 is not limited in cross section; in the second embodiment, it is shaped roughly like a letter U in cross section.

Each wall part 133 has the peripheral wall height set at least higher than the pin 112a, etc., of the FET 112 mounted on the power circuit section 101, preferably higher than the height of each FET 112. That is, the wall parts 133 are formed so as to be able to surround the power circuit section 101 containing various electronic parts (in the second embodiment, the FETs 112) In the second embodiment, the wall part 133 has the peripheral wall height set higher than the FETs 112.

Further, the wall parts 133 are provided so that the upper end opening 132 is roughly opposed to the circuit disposition area of the circuit disposition face 102a and after the surround wall member 130 is attached to the heat radiation member 102, the power circuit section 101 disposed on the heat radiation member 102 can be visually recognized through the upper end opening 132. That is, the upper end opening 132 is used to fill a water resistance resin as described later and also serves as a window used to press the power circuit section 101 in joining the power circuit section 101 to the heat radiation member 102.

In the second embodiment, each wall part 133 is formed integrally with a connector housing 136. That is, the connector housing 136 has a bottom having terminal through holes 137 into which the external connection terminals 114 of the power circuit section 101 are inserted and a hood 138 surrounding the external connection terminals 114 projected to the opposite side to the circuit disposition face 102a through the terminal through holes 137, and the connector housing 136 and the external connection terminals 114 make up an external connection connector that can be joined to another connector. In the second embodiment, the bottom of the connector housing 136 is implemented as the horizontal wall part 133b.

Specifically, in the wall parts 133, the terminal through holes 137 into which the external connection terminals 114 of the power circuit section 101 are inserted are made piercing the horizontal wall parts 133b on both the left and right sides of the upper end opening 132, and on the top face of the horizontal wall part 133b, the hoods 138 for connector formation are projected the opposite side to the heat radiation member 102 so as to surround the terminal through holes 137. That is, the hood 138 and the horizontal wall part 133b around the terminal through holes 137 make up the connector housing 136 and the connector housing 136 is provided along the length direction of each wall part 133 on both the left and right sides of the upper end opening 132. One or more external connection terminals 114 can be projected to the inside of the connector housing 136, and the connector housing 136 and one or more external connection terminals 114 make up an external connection connector that can be joined to another connector.

Figure 8A:
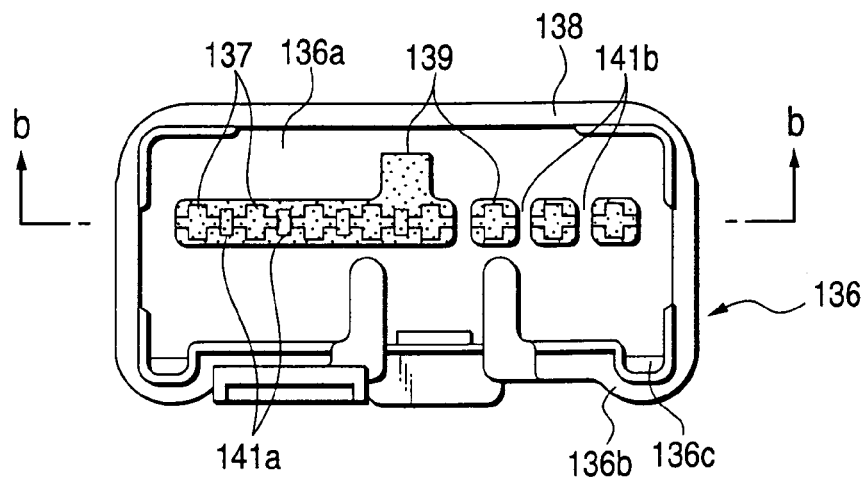
FIG. 8A is a plan view to show a connector housing of the distribution unit of the second embodiment of the invention and FIG. 8B is a sectional view taken on line b-b in FIG. 8A.

As shown in FIG. 8A, each terminal through hole 137 is formed in the shape of a cross so that when the external connection terminal 114 is inserted, a water resistance resin described later can be easily introduced into the connector housing 136 while alignment of the external connection terminal 114 is ensured. The shape of each terminal through hole 137 is not limited; preferably, if the terminal through hole 137 is formed larger than the cross-sectional shape of the external connection terminal 114, it becomes easy to introduce a water resistance resin described later into the connector housing 136. Further, as the terminal through hole 137 is formed partially swelling from the corresponding shape to the cross-sectional shape of the external connection terminal 114, alignment of the external connection terminal 114 can be ensured.

Figure 8B:
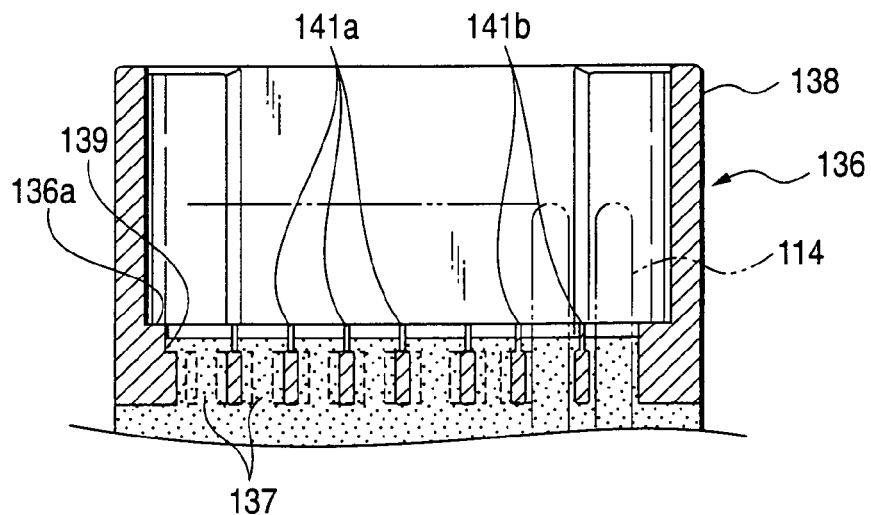

On the other hand, the connector housing 136 is formed inside with a resin reservoir recess 139 next to the connector abutment face 136a against which the tip face of another connector abuts, and the terminal through holes 137 are made in the formation area of the resin reservoir recess 139, as shown in FIGS. 7, 8A and 8B. Some connector housings 136 are formed inside with a resin insertion hole 140 communicating with the inside of the wall part 133, specifically the lower side of the horizontal wall part 133b from the resin reservoir recess 139, as shown in FIGS. 7, 8A and 8B.

The resin reservoir recess 139 is provided for introducing and filling a water resistance resin described later through the terminal through hole 137; it is inside formed with a water resistance layer 106 described later for preventing water from entering through the terminal through hole 137 to effectively prevent a short circuit in the power circuit section 101. Therefore, the water resistance resin described later overflows into the resin reservoir recess 139 through the terminal through hole 137. On the other hand, the resin insertion hole 140 is provided for aiding in and enhancing introduction of the water resistance resin from the terminal through hole 137: the water resistance resin is introduced through the resin insertion hole 140 into the resin reservoir recess 139.

The plan view shape and size of the resin reservoir recess 139 are not limited; preferably, on the plan view, the resin reservoir recess 139 has an outer margin set at a predetermined distance from the terminal through hole 137. The purpose of thus forming the outer margin at the predetermined distance from the terminal through hole 137 is to sufficiently fill the water resistance resin described later into the surroundings of the terminal through hole 137.

The height of the resin reservoir recess 139 to the bottom is set higher than at least the upper margin height of the pin 112a of the FET 112 in the attitude when the water resistance resin described later is filled. That is, with the circuit disposition face 102a as the reference level, the height of the resin reservoir recess 139 to the bottom is set higher than at least the upper margin height of the pin 112a of the FET 112. Therefore, when the water resistance resin overflows into the resin reservoir recess 139 through the resin insertion hole 140, the pin 112a of the FET 112 is sealed with the water resistance resin in the wall part 133, as shown in FIG. 11. In the second embodiment, with the circuit disposition face 102a as the reference level, the height of the resin reservoir recess 139 to the bottom is set roughly equal to the upper end height of the FET 112; the height of the resin reservoir recess 139 to the upper margin is set higher than the upper end height of the FET 112.

At the bottom of the connector housing 136 in the area in which the resin reservoir recess 139 is provided, insulating projection ribs 141a and 141b are projected on the opposite side to the heat radiation member 102. Specifically, the projection rib 141a, 141b is projected on the bottom of the connector housing 136 between the terminal through holes 137 and can intervene between the external connection terminals 114, as shown in FIGS. 8A and 8B.

The projection ribs 141a and 141b are first projection ribs 141a provided like a sandbank in the resin reservoir recess 139 and second projection ribs 141b provided in a state in which they divide the resin reservoir recess 139 in the resin reservoir recess 139. That is, both side margins of the first projection rib 141a are provided at a distance from both sides of the resin reservoir recess 139; both side margins of the second projection rib 141b are provided integrally with both sides of the resin reservoir recess 139.

The projection rib 141a, 141b has a tip face formed to the height of the connector abutment face 136a, and another connector is abutted against the tip face as well as the connector abutment face 136a. Therefore, the height of the projection rib 141a, 141b is also set higher than at least the upper margin height of the pin 112a of the FET 112 in the attitude when the water resistance resin described later is filled.

In the second embodiment, the projection rib 141a, 141b is formed roughly like a rectangular parallelepiped, but the shape of the projection rib 141a, 141b is not limited.

A part of the connector housing 136 positioned at the lower end when the connector housing 136 is longitudinally mounted is locally swelled to the outside, and a drain hole 136c opened to the heat radiation member 102 side and the outside from the resin seal member 104 is made in the horizontal wall part 133b in the swelling part 13b. The drain hole 136c is provided for draining water from the connector housing 136, and the water drained through the drain hole 136c is passed through a drain passage 150 between the heat radiation member 102 and the surround wall member 130 and is discharged to the outside.

The second vertical wall part 133c has a drain notch 151 in a lower part when the distribution unit is longitudinally mounted, and the drain notch 151 is formed at the same level as or above the surface of the water resistance layer 106 described later. Press and stop projection parts 152 for pressing and stopping the bus bars 110 forming the external connection terminals 114 are projected on the lower face of the horizontal wall part 133b.

On the other hand, the skirt section 134 is shaped like a frame covering the four peripheral sides of the heat radiation member 102 and a pair of side walls opposed to each other is formed like asperities corresponding to the shape of the heat radiation fins 120. The skirt section 134 is formed at proper locations with retention claws 153 in the corresponding parts of the heat radiation member 102 so that the surround wall member 130 and the heat radiation member 102 can be assembled firmly.

The lid 131 has a plate-like shape corresponding to the upper end opening 132 of the surround wall member 130 and is attached to the surround wall member 130 with a retention structure (not shown) or by bonding, adhesion, welding, etc.

The lid 131 can be omitted as required; however, preferably the lid 131 is provided from the viewpoint of circumventing exposure of the inside of the surround wall member 130 and protecting the power circuit section 101 from an external shock.

The resin seal member 104 is formed like an annular shape surrounding the circuit disposition area and can be hermetically fitted into the seal member fill groove 135. The resin seal member 104 is provided for temporarily preventing a liquid water resistance resin (described later) from leaking from the surround wall member 130 until the water resistance resin hardens and therefore the resin seal member 104 does not require durability over a long term and can use a comparatively inexpensive material. The resin seal member 4 is not limited; a material having given elasticity, for example, expanded rubber is used preferably from the viewpoint of reliably closing the gap between the wall parts 133 and the heat radiation member 102. The material used as the resin seal member 104 is not limited either; preferably chloroprene rubber, etc., is used from the viewpoint of cost efficiency, universal use, workability, etc.

On the other hand, the water resistance layer 106 is provided in a state in which at least a part of the power circuit section 101 is sealed inside the surround wall member 130, and the water resistance layer 106 also leads to the inside of the connector housing 136 through the terminal through hole 137. The top face of the water resistance layer 106 is set higher than the bottom of the connector housing 136 in the connector housing 136 and is set lower than the projection ribs 141a, 141b. A specific description is given later and therefore is not made here.

Next, a manufacturing method of the distribution unit will be discussed.

To manufacture the power module, first the power circuit section 101 and the heat radiation member 102 are formed (power circuit section formation step and heat radiation member formation step) and the surround wall member 130 is formed (surround wall member formation step an connector housing formation step).

The resin seal member 104 is filled into the seal member fill groove 135 of the surround wall member 130 in a hermetic state, and the external connection terminals 114 are inserted into the terminal through holes 137 to fit the power circuit section 101 into the surround wall member 130. As the power circuit section 101 is thus previously fitted into the surround wall member 130, the alignment of the external connection terminals 114 with the terminal through holes 137 can be ensured. At this time, the projection rib 141a, 141b intervenes between the base end parts of the projection parts of the external connection terminals 114 projected from the terminal through holes 137.

Next, the same adhesive as the adhesive forming the insulating layer 105 is applied to the circuit disposition area of the heat radiation member 102 and the resin seal member 104 is brought into intimate contact with the top of the circuit disposition face. 102a surrounding the circuit disposition area of the heat radiation member 102. In this state, the surround wall member 130 into which the power circuit section 101 is fitted is attached to the heat radiation member 102. At this time, the power circuit section 101 is joined to the circuit disposition area on the circuit disposition face 102a of the heat radiation member 102 with the above-mentioned adhesive.

To attach the surround wall member 130 to the heat radiation member 102, the retention claws 153 of the skirt section 134 are retained in the corresponding parts of the heat radiation member 102. For example, the surround wall member 130 may be attached at proper parts with mechanical fixing parts of screws, bolts, etc., or by bonding, adhesion, etc.; any known attachment method is adopted. To use a resin having an adhesive property as the water resistance resin described later, the surround wall member 130 may be attached to the heat radiation member 102 by temporary tacking.

On the other hand, to attach the power circuit section 101 to the circuit disposition area of the heat radiation member 102, the same adhesive as the adhesive forming the insulating layer 105 (in the second embodiment, adhesive made of epoxy-based resin) is applied; any other adhesive having high thermal conductivity may be applied, needless to say. However, as the same adhesive as the adhesive forming the insulating layer 105 is applied, the insulting layer 105 is formed reliably. That is, for example, if a pin hole occurs when the insulting layer 105 is formed, the pin hole is filled up in the applying work of the adhesive and the adhesive for bonding the power circuit section 101 forms a part of the insulting layer 105, so that the power circuit section 101 and the heat radiation member 102 can be reliably insulated from each other.

Then, the power circuit section 101 is pressed at proper parts through the upper end opening 132 of the surround wall member 130, particularly the fringes of the power circuit section 101 and the periphery of each FET 112 are pressed for firmly joining the power circuit section 101 to the circuit disposition area of the heat radiation member 102. As the power circuit section 101 is thus pressed and joined to the heat radiation member 102, the bus bars 110 positioned on the back of the power circuit section 101 are embedded in the adhesive, so that a short circuit between the bus bars 110 can be prevented reliably because of the insulating property of the adhesive and the thermal conductivity between the power circuit section 101 and the heat radiation member 102 can be enhanced.

Thus, the power circuit section 101 is disposed in the circuit disposition area on the circuit disposition face 102a of the heat radiation member 102 (circuit disposition step) and the surround walls surrounding the circuit disposition area on the circuit disposition face 102a of the heat radiation member 102 containing the power circuit section 101 are formed by the surround wall member 130 and function as a weir for the water resistance resin (surround wall formation step).

After the surround wall formation step and the circuit disposition step, a predetermined amount of liquid water resistance resin is filled into the space surrounded by the surround wall member 130 and is hardened to form the water resistance layer 106.

Figure 9:
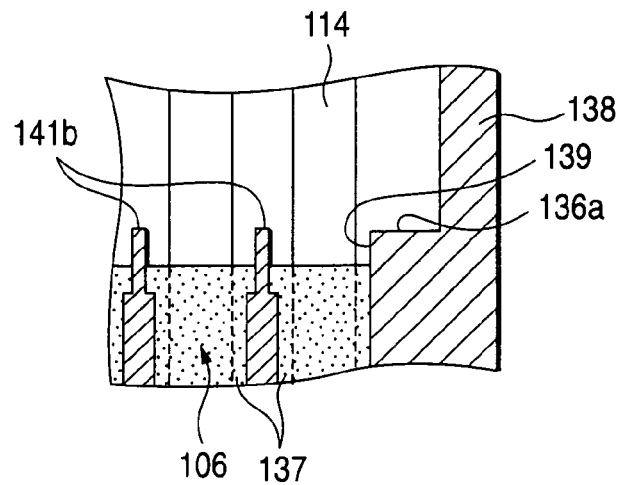
FIG. 9 is a perspective view to show the top face of a water resistance layer in the connector housing of the distribution unit of the second embodiment of the invention.
Figure 10:
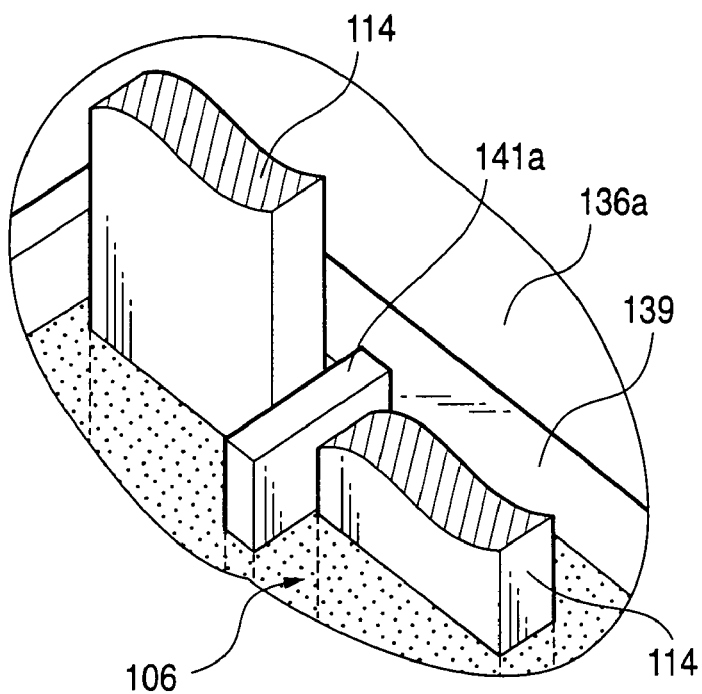
FIG. 10 is an enlarged sectional view of the main part of the connector housing of the distribution unit of the second embodiment of the invention.

Specifically, first the heat radiation member 102 to which the surround wall member 130 is attached and on which the power circuit section 101 is disposed is set with the circuit disposition face 102a upward, and the liquid water resistance resin is filled through the upper end opening 132 of the surround wall member 130. The liquid water resistance resin is filled to the state in which the various electronic parts (FETs 112) mounted on the power circuit section 101 are sealed. At this time, the water resistance resin overflows into the connector housing 136 through the terminal through holes 137 and the resin insertion hole 140; the amount of the water resistance resin is set so that the water resistance resin reaches to such an extent that it does not reach the tips of the projection ribs 141a, 141b in the resin reservoir recess 139, as shown in FIGS. 9 and 10.

In the state in which the water resistance resin is filled, control circuit board 113 and the bus bar implementation board 111 containing the base end parts of the external connection terminals 114 are also immersed in the water resistance resin, but-the tips of the projection ribs 141a and 141b are projected from the top face of the water resistance resin. On the other hand, the circuit disposition area is surrounded by the resin seal member 104 and thus even the liquid water resistance resin does not leak from the gap between the heat radiation member 102 and the surround wall member 130.

The water resistance resin may be any if it provides water resistance; the material, etc., of the water resistance resin is not limited. However, as a liquid resin is used as in the second embodiment, the water resistance resin can reach all parts of the surround wall member 130 for providing reliable sealing. Preferably, if a material having given elasticity and shape retention after being hardened is used as the water resistance resin, the effect on the FETs 112, soldering, etc., is small. Further, preferably a silicone-based resin, etc., is used from the viewpoint of providing not only excellent heat resistance and cold protection, but also good electric insulating properties. If a material having an adhesive property is adopted as the water resistance resin, applying work of a primer, etc., can be skipped and work can be more simplified. Further, if a material excellent in thermal conductivity is adopted as the water resistance resin, heat radiation of the heat radiation member 102 is promoted and in addition, heat is also radiated from the water resistance layer 106, so that the heat radiation property can be made superior.

The filled water resistance resin is thermally hardened to form the water resistance layer 106. Thus, the water resistance layer 106 is formed on the inside of the surround wall member 130 and in the lower end part of the connector housing 136; it is formed sealing at least a part of the power circuit section 101 and the terminal through holes 137. On the other hand, the water resistance layer 106 is formed in the state in which the projection ribs 141a and 141b are projected from the top face of the water resistance layer 106, as shown in FIGS. 9 and 10.

Next, the lid 131 covering the upper end opening 132 of the surround wall member 130 is manufactured and the water resistance layer 106 is formed and then the lid 131 is attached to the surround wall member 130 with the upper end opening 132 covered. The attachment structure is previously described and therefore will not be discussed again.

Manufacturing the distribution unit is now complete.

According to the distribution unit, the water resistance layer 106 is formed on the inside of the surround wall member 130 for sealing the bus bar implementation board 111, the various electronic parts such as the FETs 112, and the control circuit board 113 except the external connection terminals 114 of the power circuit section 101, so that effective water resistance of the power circuit section 101 can be provided. Moreover, the water resistance layer 106 seals the terminal through holes 137. That is, the water resistance layer 106 sealing the power circuit section 101 is used to seal the terminal through holes 137 in the connector housing 136, so that water resistance of the external connection terminals 114 to the terminal through holes 137 can be provided according to the simple structure and effective water resistance of the connector and by extension of the whole distribution unit can be provided.

Particularly, according to the distribution unit of the second embodiment, the water resistance layer 106 reaches the inside of the connector housing 136 through the terminal through holes 137 and the top face of the water resistance layer 106 is set higher than the bottom of the connector housing 136, so that when the water resistance resin is filled, the water resistance resin overflowing into the connector housing 136 from the terminal through holes 137 can be visually recognized and accordingly the base end parts of the external connection terminals 114 can be sealed and insulated reliably.

Moreover, the water resistance resin is filled so as to become lower than the tip of the projection rib 141a, 141b and therefore the top face of the water resistance layer 106 is set lower than the tip of the projection rib 141a, 141b. Accordingly, the external connection terminals 114 projected from the water resistance layer 106 can be insulated from each other reliably by the projection ribs. The portions of the external connection terminals 114 projected higher than the height of the projection rib 141a, 141b are insulated as the connector is connected to another connector. For example, if a water drop, etc., is deposited on the top face of the water resistance layer 106, the projection rib further projected upward from the water resistance layer 106 can serve as a barrier, reliably preventing the deposited water drop from intervening directly between the adjacent external connection terminals 114 and causing a short circuit therebetween.

Further, since the tip face of a different connector abuts the tip faces of the projection ribs 141a and 141b and the connector abutment face 136a, when the different connector is connected, it can be positioned reliably. Moreover, the top face of the water resistance layer 106 is set lower than the tip of the projection rib 141a, 141b in the resin reservoir recess 139, so that a situation in which the water resistance layer 106 becomes an obstacle when the connector is connected to the different connector is circumvented.

On the other hand, according to the manufacturing method of the distribution unit, liquid water resistance resin is filled into the space surrounded by the surround wall member 130 and then is hardened to form the water resistance layer 106 for sealing a part of the power circuit section 101, so that water resistance in the power circuit section 101 can be provided. On the other hand, a part of the water resistance resin is introduced into the connector housing 136 through the terminal through hole 137 and the water resistance layer 106 is formed sealing the terminal through holes 137 in the presence of the water resistance resin in the connector housing 136, so that it is not necessary to provide an additional step for water resistance in the connector and effective water resistance of the connector and by extension of the whole distribution unit can be provided easily. Moreover, water resistance in the connector can be provided easily and thus the manufacturing efficiency is improved.

Moreover, the height of the bottom of the resin reservoir recess 139 is set roughly equal to the upper end height of the FET 112, so that when the terminal through holes 137 are sealed, the power circuit section 101 can be sealed containing the FETs 112 and effective water resistance of the whole distribution unit can be provided in a small amount of water resistance resin. Moreover, when the water resistance resin overflows into the resin reservoir recess 139, the power circuit section 101 containing the FETs 112 is also sealed with the water resistance resin and the reference of the fill amount of the water resistance resin can be set. Sine the upper margin of the resin reservoir recess 139 is set higher than the upper end of the FET 112, the whole FET 112 can be sealed with the water resistance layer 106. Even in this state, the water resistance resin does not overflow the resin reservoir recess 139, so that while water resistance of the whole distribution unit is provided reliably, connectivity to another connector can be ensured.

Although the distribution unit and its manufacturing method according to the second embodiment have been described, it is to be understood that the distribution unit and its manufacturing method according to the invention are not limited to the second embodiment and various modifications can be made without departing from the spirit and the scope of the invention. For example, the following modifications can be made:

(1) The order of the steps is not limited to the order in which the circuit disposition step and the surround wall formation step are executed at the same time as in the embodiment and may be any order in which the surround wall formation step is executed after the circuit disposition step, for example. However, the surround wall formation step and the circuit disposition step are executed at the same time, whereby it becomes easy to position the power circuit section 101 and the work efficiency is improved.

(2) In the embodiment, the connector housing 136 formed integrally with the surround wall member 130 is used and the connector formation step and the surround wall formation step are executed at the same time, but the connector housing 136 may be a separate part or may be formed integrally with the lid of the case. However, the bottom of the connector housing needs to placed lower than the upper margin of the surround wall member and needs to be disposed in the water resistance resin before the water resistance-resin is hardened.

(3) The shape of the distribution unit is not limited to that in the embodiment and may be any other shape.

(4) In the embodiment, a thermosetting resin is used as the water resistance resin and this water resistance resin is thermally hardened to form the water resistance layer 106, but the method of forming the water resistance layer 106 is not limited to it. As filled water resistance resin is left standing for a predetermined time, the water resistance resin may naturally harden to form the water resistance layer 106.

As described above, according to the first aspect of the invention, while a short circuit between the fuse connection terminals is prevented reliably according to the simple structure, the fuse connection terminals are formed in the state in which they are placed near to each other, so that the distribution can be furthermore miniaturized.

On the other hand, according to the second aspect of the invention, the electric connection box includes the distribution unit that can be made more compact, so that the electric connection box itself can be made compact. Moreover, the fuse element is placed saddling the unit side fuse connection terminal and the bus bar board side fuse connection terminal, so that the occupation area of the bus bar board itself can also be reduced as compared with the case where all fuse elements are assembled on the board. Since the unit side fuse connection terminal and the bus bar board side fuse connection terminal are electrically connected through the fuse element, the number of connection parts decreases and the structure is simplified and the connection reliability is enhanced accordingly as compared with the case where bus bar terminals are abutted against each other and are joined aside from the disposition part of the fuse element.

Further, according to the sixth aspect of the invention, the external connection terminals are formed in the state in which they are placed near to each other, so that the distribution can be furthermore miniaturized, and the surround wall member can be formed inside with the water resistance layer for sealing a part of the power circuit section to provide effective water resistance of the power circuit section. Moreover, the water resistance layer leads to the inside of the connector housing through the terminal through hole and the top face of the water resistance layer is set higher than the bottom of the connector housing, so that the water resistance layer being formed in the connector housing can be visually recognized and thus the base end parts of the external connection terminals containing the terminal through holes can be sealed reliably with the water resistance layer and insulation at the base end parts of the external connection terminals can be ensured reliably. On the other hand, at the bottom of the connector housing, the insulating projection rib intervening between the external connection terminals and having the tip against which the different connector is abutted is projected on the tip side of the external connection terminals, and the top face of the water resistance layer is set lower than the projection rib. Thus, for example, if a water drop is deposited on the top face of the water resistance layer, the projection rib further projected upward from the water resistance layer can serve as a barrier, reliably preventing the water drop from causing a direct short circuit between the adjacent external connection terminals.

According to the eighth aspect of the invention, to join an external terminal to the external connection terminal from the direction roughly parallel with the circuit disposition face, the extension part can be placed at a distance from the heat radiation member in the presence of the upright part, so that the extension part can be placed at a sufficient distance from the heat radiation member and a short circuit in the extension part of the external connection terminal can be prevented reliably. The deflection regulation part can regulate deflection of the upright part caused by the external force (insertion force) acting on the extension part at the connecting time with a different external terminal. That is, the external force (insertion force) acting on the extension part at the connecting time with the different external terminal can be substantially supported on the deflection regulation part. Therefore, various disadvantages occurring as the insertion force propagates to the power circuit sections along the bus bar can be circumvented.

What is claimed is:

1. A distribution unit comprising:
a heat radiation member having a circuit disposition face;
a power circuit section including a plurality of bus bars disposed on the circuit disposition face;
external connection terminals formed by folding up ends of the bus bars placed near to each other from the circuit disposition face;
a surround wall member disposed on the heat radiation member so as to surround the power circuit section including the external connection terminals;
a connector housing including a bottom having terminal through holes into which the external connection terminals are inserted and a hood surrounding the external connection terminals projected to the opposite side to the circuit disposition face through the terminal through holes, the connector housing and the external connection terminals making up an external connection connector being connectable to a different connector; and
a water resistance layer;
wherein at the bottom of the connector housing, an insulating projection rib intervening between the external connection terminals and having a tip against which the different connector is abutted is projected toward the tip side of the external connection terminals; and
the water resistance layer is formed in a state in which at least a part of the power circuit section is sealed inside the surround wall member and the water resistance layer leads to the inside of the connector housing through the terminal through hole and the top face of the water resistance layer is set higher than the bottom of the connector housing and is set lower than the tip face of the projection rib.

2. The distribution unit as claimed in claim 1, wherein the connector housing is formed at the bottom with a resin reservoir recess next to the connector abutment face against which the tip face of the different connector abuts;
the terminal through holes are made in the formation area of the resin reservoir recess;
the projection rib is provided at the connector bottom between the terminal through holes; and
the tip face of the projection rib is positioned corresponding to the connector abutment face.

3. A distribution unit comprising:
a power circuit section including a plurality of bus bars with electronic parts mounted on at least some of the bus bars;
a heat radiation member having a circuit disposition face on which the power circuit section is disposed; and
a case for covering the power circuit section;
wherein ends of a plurality of specific bus bars included in the power circuit section are projected from the case to form external connection terminals;
each of specific external connection terminals of the external connection terminals has an upright part rising from the circuit disposition face and an extension part extending from the tip of the upright part to the outside of the circuit disposition face substantially in parallel with the circuit disposition face;
a different external terminal can be inserted into or removed from the external connection terminal through the tip part side of the extension part; and
the external connection terminal is provided with a deflection regulation part for abutting the upright part for regulating deflection on the opposite side to the extension direction of the extension part.

4. The distribution unit as claimed in claim 3, wherein the deflection regulation part is provided integrally with the case.

5. The distribution unit as claimed in claim 3, wherein at a tip part in the extension part of each of the specific external connection terminals, a tip slot part into which a different external terminal is inserted is formed along the extension direction of the extension part.

6. The distribution unit as claimed in claim 4, wherein at a tip part in the extension part of each of the specific external connection terminals, a tip slot part into which a different external terminal is inserted is formed along the extension direction of the extension part.

* * * * *